United States Patent
Yu et al.

(10) Patent No.: US 12,228,776 B2
(45) Date of Patent: Feb. 18, 2025

(54) PACKAGE WITH INTEGRATED OPTICAL DIE AND METHOD FORMING SAME

(71) Applicant: Taiwan Semiconductor Manufacturing Co., Ltd., Hsinchu (TW)

(72) Inventors: Chen-Hua Yu, Hsinchu (TW); Jiun Yi Wu, Zhongli (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 278 days.

(21) Appl. No.: 17/656,248

(22) Filed: Mar. 24, 2022

(65) Prior Publication Data

US 2023/0244043 A1    Aug. 3, 2023

Related U.S. Application Data

(60) Provisional application No. 63/267,322, filed on Jan. 31, 2022.

(51) Int. Cl.
*G02B 6/42* (2006.01)
*H01L 27/146* (2006.01)

(52) U.S. Cl.
CPC ...... *G02B 6/4206* (2013.01); *H01L 27/14618* (2013.01); *H01L 27/14625* (2013.01); *H01L 27/14627* (2013.01); *H01L 27/14634* (2013.01); *H01L 27/1464* (2013.01); *H01L 27/14685* (2013.01); *H01L 27/14669* (2013.01); *H01L 27/14698* (2013.01)

(58) Field of Classification Search
CPC ... G02B 6/13; G02B 6/4206; H01L 27/14687; H01L 27/14618; H01L 2924/181
See application file for complete search history.

(56) References Cited

U.S. PATENT DOCUMENTS

| | | | |
|---|---|---|---|
| 7,919,348 B2* | 4/2011 | Akram | H01L 27/14636 257/E31.117 |
| 11,276,806 B2 | 3/2022 | Chiang | |
| 2007/0045515 A1* | 3/2007 | Farnworth | H01L 27/14632 257/E31.128 |
| 2008/0191333 A1 | 8/2008 | Yang | |
| 2010/0019339 A1 | 1/2010 | Walberg | |
| 2014/0070348 A1 | 3/2014 | Yee et al. | |
| 2018/0138101 A1 | 5/2018 | Yu et al. | |

(Continued)

FOREIGN PATENT DOCUMENTS

| CN | 111128978 A | 5/2020 |
|---|---|---|
| KR | 20140032856 A | 3/2014 |

(Continued)

*Primary Examiner* — Michelle R Connelly
*Assistant Examiner* — Kirsten D. Endresen
(74) *Attorney, Agent, or Firm* — Slater Matsil, LLP

(57) ABSTRACT

A method includes forming a package, which includes an optical die and a protection layer attached to the optical die. The optical die includes a micro lens, with the protection layer and the micro lens being on a same side of the optical die. The method further includes encapsulating the package in an encapsulant, planarizing the encapsulant to reveal the protection layer, and removing the protection layer to form a recess in the encapsulant. The optical die is underlying the recess, with the micro lens facing the recess.

20 Claims, 27 Drawing Sheets

(56) References Cited

U.S. PATENT DOCUMENTS

| | | | |
|---|---|---|---|
| 2019/0123109 A1* | 4/2019 | Xie | G02B 27/0955 |
| 2020/0006088 A1* | 1/2020 | Yu | G02B 6/30 |
| 2020/0105638 A1* | 4/2020 | Chiang | H01L 21/561 |
| 2021/0074866 A1 | 3/2021 | Dobriyal | |
| 2023/0036239 A1* | 2/2023 | Espiritu | H01L 27/14636 |
| 2023/0135956 A1 | 5/2023 | Hogyoku | |

FOREIGN PATENT DOCUMENTS

| | | |
|---|---|---|
| KR | 20180054440 A | 5/2018 |
| KR | 20200001473 A | 1/2020 |
| KR | 20200036697 A | 4/2020 |
| TW | 200834938 A | 8/2008 |
| TW | 202127604 A | 7/2021 |
| WO | 2021200094 A1 | 10/2021 |

\* cited by examiner

PACKAGE WITH INTEGRATED OPTICAL DIE AND METHOD FORMING SAME

PRIORITY CLAIM AND CROSS-REFERENCE

This application claims the benefit of the following provisionally filed U.S. Patent application: Application No. 63/267,322, filed on Jan. 31, 2022, and entitled "Optical Engine Integration for CoWoS Packaged Application," which application is hereby incorporated herein by reference.

BACKGROUND

Electrical and optical signaling and processing are techniques for signal transmission and processing. Optical signaling and processing have been used in increasingly more applications in recent years, and have been typically combined with electrical signaling and processing to provide full-fledged applications. Packages thus may include both of optical (photonic) dies including optical devices and electronic dies including electronic devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
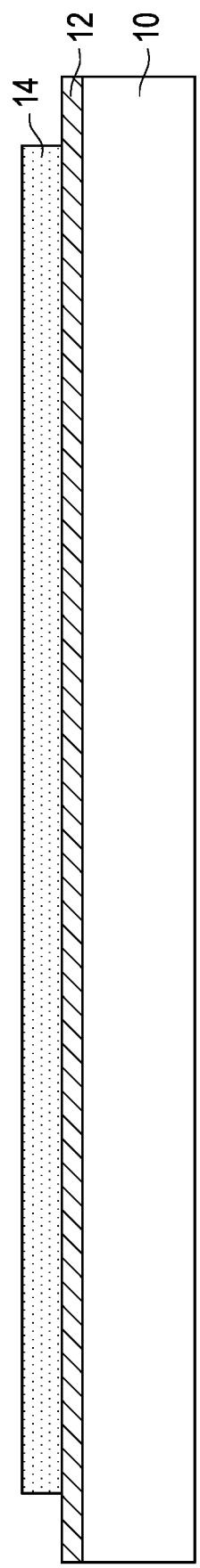
FIGS. 1-12 illustrate the cross-sectional views of intermediate stages in the formation of a package including an optical die and additional dies in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including an optical die and additional dies and the method of forming the same are provided. In accordance with some embodiments of the present disclosure, an optical die is formed, which includes a micro lens on the backside of the optical die. A protection layer, which may be a die-attach film, is attached/formed on the backside of the optical die. The optical die is bonded to another package component, with its front surface facing the package component. The optical die and the protection layer are then encapsulated in an encapsulant, and the encapsulant is planarized. The protection layer is then removed to reveal the optical die. By adopting the protection layer, the optical die is not planarized in the planarization process, and the micro lens is not damaged or contaminated by the planarization. The damage or contamination may degrade the transmission after fiber attachment. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 12 illustrate the cross-sectional views of intermediate stages in the formation of a package including an optical die in accordance with some embodiments of the present disclosure. The corresponding processes are also reflected schematically in the process flow shown in FIG. 26.

Referring to FIG. 1, release film 12 is formed on carrier 10. Carrier 10 may be a glass carrier, an organic carrier, or the like. Release film 12 is coated on carrier 10 for attaching optical dies to carrier 10. Release film 12 may be formed of a polymer-based material (such as a Light-To-Heat-Conversion (LTHC) material), which may be decomposed in subsequently processes.

Figure 26:
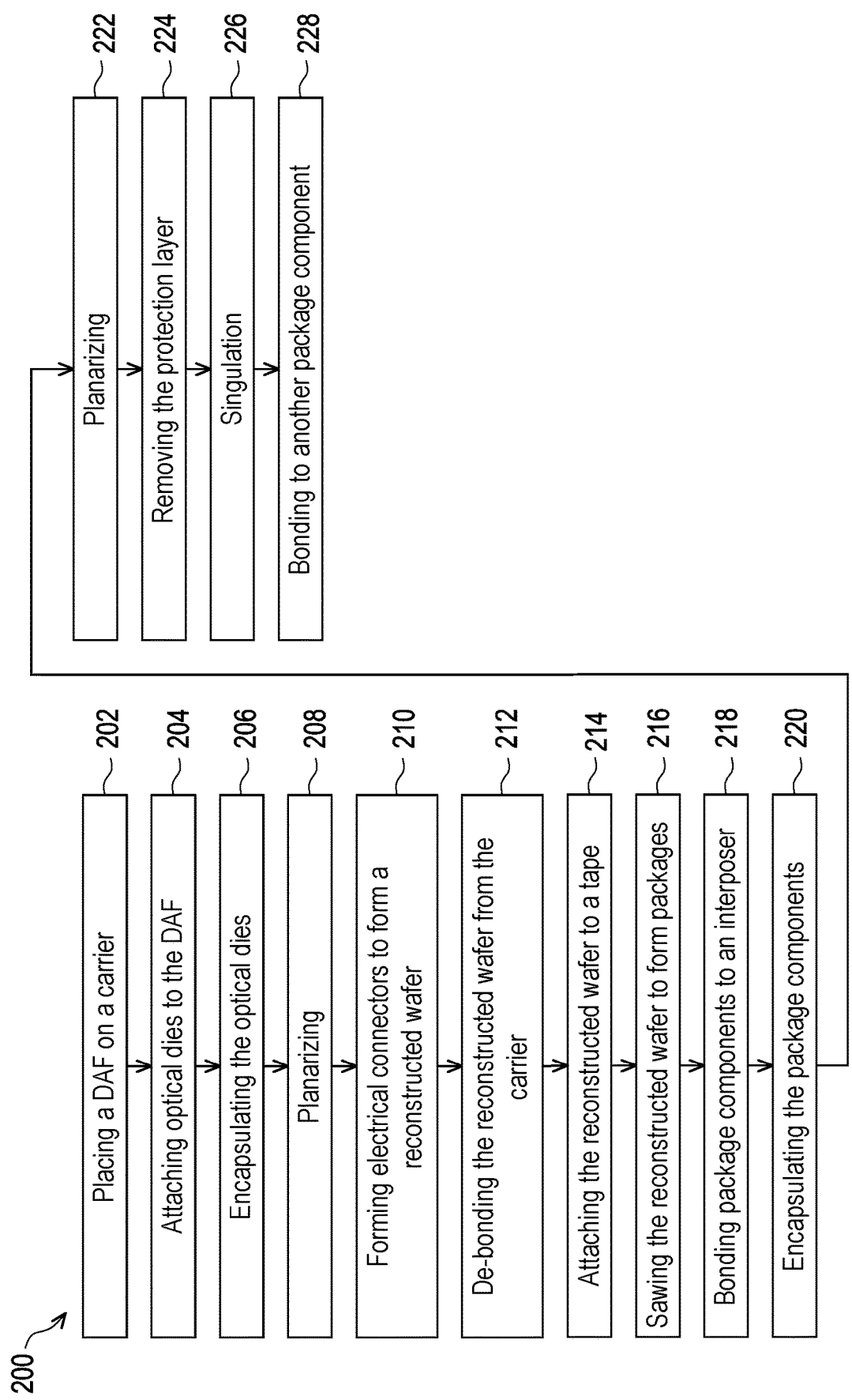
FIG. 26 illustrates a process flow for forming a package including an optical die and additional dies in accordance with some embodiments.

Die-Attach Film (DAF) 14 is placed or formed on release film 12. The respective process is illustrated as process 202 in the process flow 200 as shown in FIG. 26. DAF 14 is an adhesive film that can adhere to the underlying release film 12 and the subsequently placed optical dies. DAF 14 is used as a protection layer to protect optical dies in subsequent processes, and hence is alternatively referred to as a protection layer. As will be discussed in subsequent paragraphs in accordance with alternative embodiments, the protection layer for protecting the optical die(s) may also be formed of materials other than DAF. DAF 14 may include an organic material such as a polymer, a resin, an epoxy, or the like in accordance with some embodiments. The thickness of DAF 14 may be greater than about 2 µm, and may be in the range between about 2 µm and about 50 µm.

Figure 2:
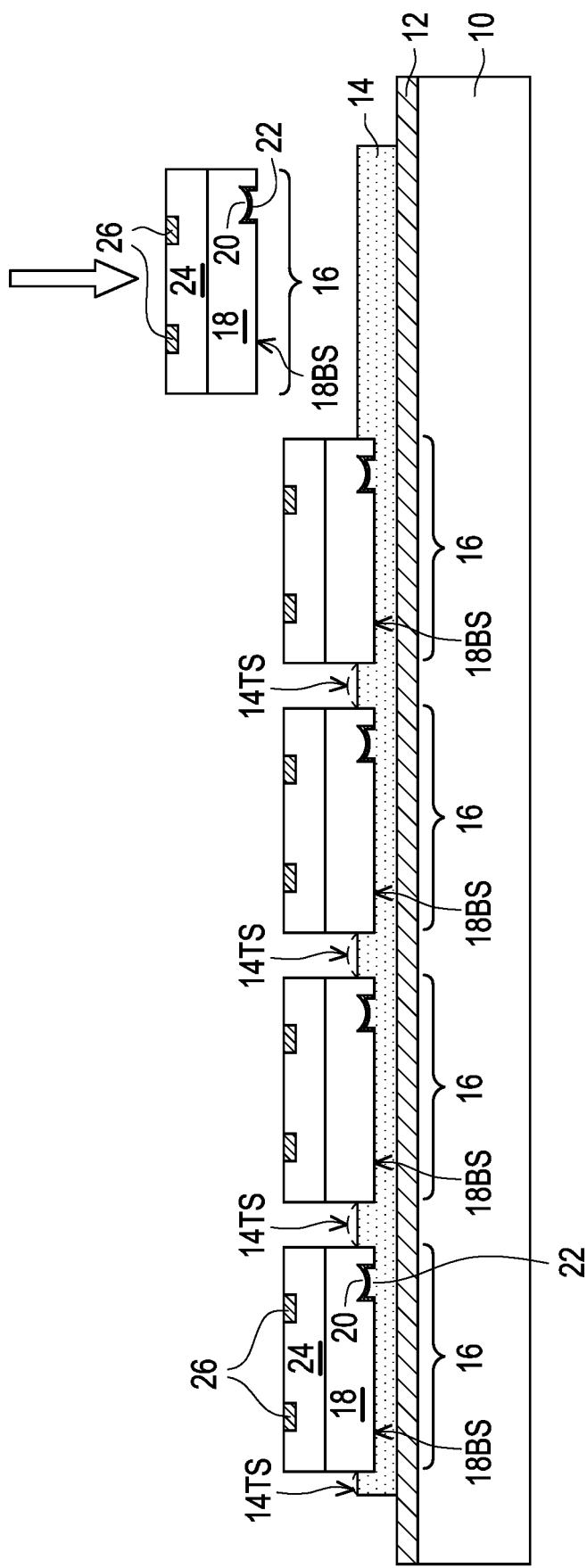

Referring to FIG. 2, a plurality of optical dies 16 are attached to DAF 14. The respective process is illustrated as process 204 in the process flow 200 as shown in FIG. 26. In accordance with some embodiments, optical dies 16 include semiconductor substrates 18, micro lens 20, interconnect structures 24, and electrical connectors 26. Although one micro lens 20 is shown, there may be a plurality of micro lenses in each of optical dies 16. In accordance with some embodiments, optical dies 16 may include optical modules therein.

One of optical dies 16 is discussed briefly below, and the discussion also applies to other optical dies 16. In accordance with some embodiments, substrate 18 may be a transparent semiconductor substrate such as a silicon substrate. Interconnect structure 24 may include a plurality of dielectric layers, and metal lines and vias in the plurality of dielectric layers. Optical devices such as silicon waveguides, non-silicon waveguides, grating couplers, or the like may also be formed in the dielectric layers. The optical devices in optical dies 16 may optically couple to the micro lens 20. Optical dies 16 may or may not include photo diodes and/or electrical devices such as controllers, drivers, amplifiers, the like, or combinations thereof.

Figure 25:
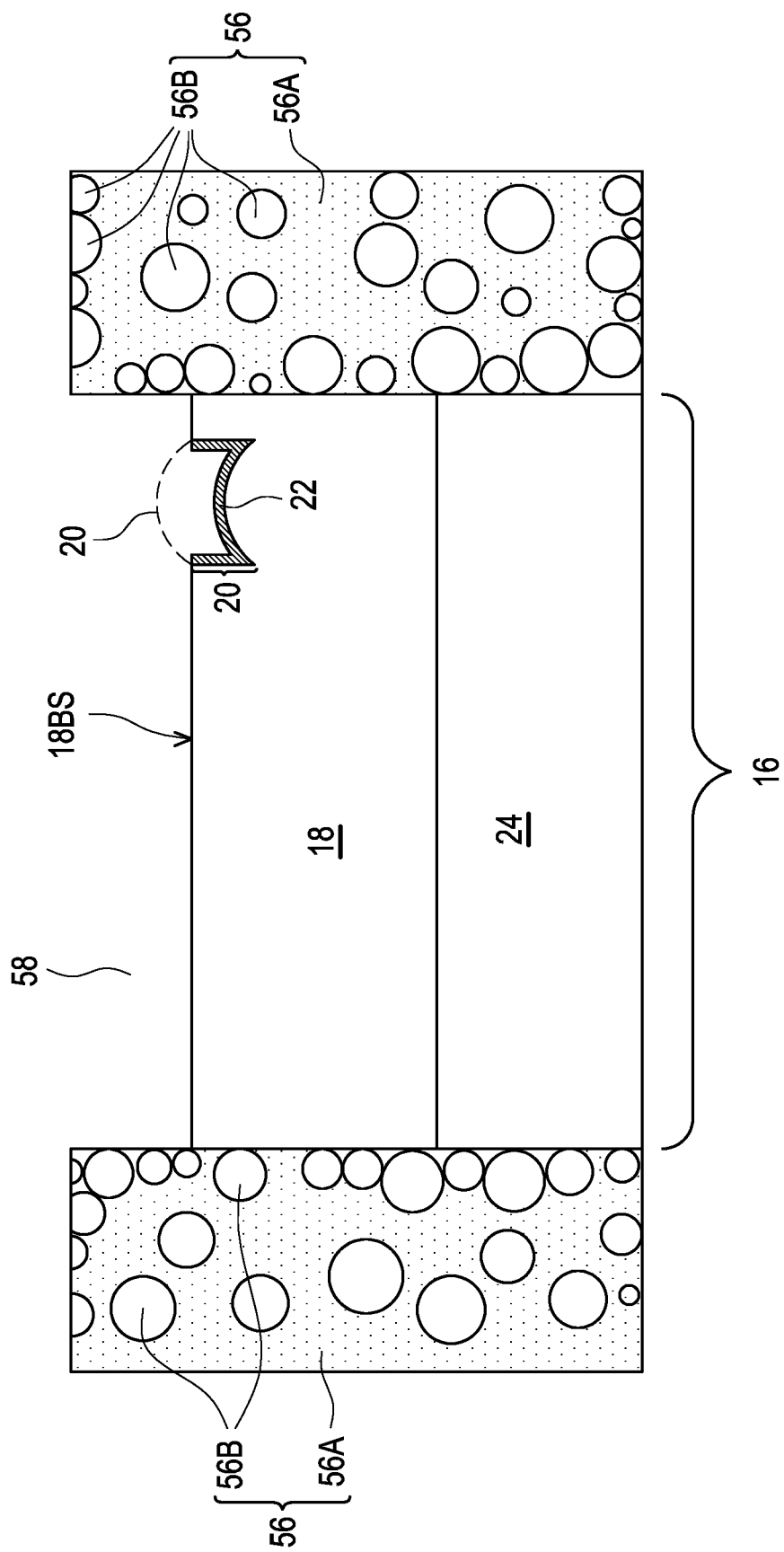

Micro lens 20 may be formed as an integrated part of substrate 18, for example, by etching substrate 18 so that a part of substrate 18 has curved surfaces to act as the micro lens. In accordance with some embodiments, micro lens 20 is recessed from the back surface 18BS (the illustrated bottom surface) of substrate 18, wherein the back surface 18BS is also the back surface of the corresponding optical die 16. In accordance with alternative embodiments, micro lens 20 protrudes out of back surface 18BS of substrate 18. For example, FIG. 25 illustrates an example protruding micro lens 20 using a dashed line, which protrudes out of back surface 18BS of substrate 18. In accordance with some embodiments, transparent protection layer 22 is formed on the micro lens 20. Transparent protection layer 22 may be formed of silicon oxide in accordance with some example embodiments.

The plurality of optical dies 16 have their back surfaces 18BS contacting DAF 14. In accordance with some embodiments, DAF 14 extends partially into the recesses in substrate 18, in which micro lens 20 is located. Accordingly, DAF 14 may be spaced apart from micro lens 20 by air gaps. In accordance with alternative embodiments, DAF 14 extends into and fully occupy the recess to contact micro lens 20. When micro lens 20 is a protruding micro lens, it extends into DAF 14. In accordance with some embodiments, optical dies 16 are slight pressed against and into DAF 14. Since DAF 14 is formed of a flexible material, some small portions of DAF 14 in the spaces between neighboring optical dies 16 may protrude higher than the rest of the top surface of DAF 14. Furthermore, since DAF 14 is squeezed when optical dies 16 are placed, the top surfaces of DAF 14 between neighboring optical dies 16 may be curved, as represented by the dashed top surfaces 14TS.

Figure 3:
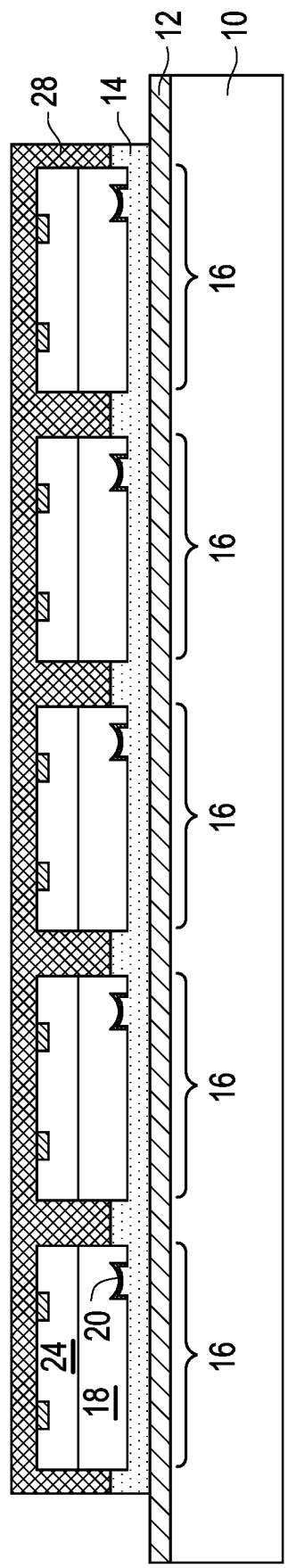

Next, as shown in FIG. 3, optical dies 16 are encapsulated in encapsulant 28. The respective process is illustrated as process 206 in the process flow 200 as shown in FIG. 26.

Encapsulant 28 may include a molding compound, a molding underfill, an epoxy, and/or a resin. Encapsulant 28 may include a base material 28A (FIG. 24), which may be a polymer, a resin, an epoxy, or the like, and filler particles 28B in base material 28A. The filler particles may be dielectric particles of $SiO_2$, $Al_2O_3$, silica, or the like, and may have spherical shapes. Also, the spherical filler particles may have the same or different diameters. Encapsulant 28 has bottom surfaces contacting the top surfaces of DAF 14, and the top surface of encapsulant 28 is higher than the top surfaces of optical dies 16.

Figure 4:
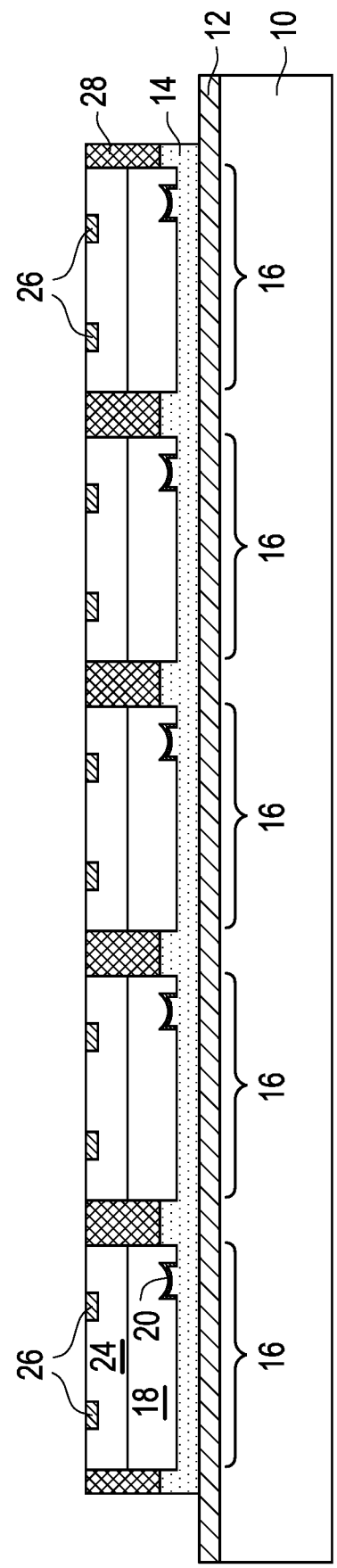

In a subsequent step, as shown in FIG. 4, a planarization process such as a Chemical Mechanical Polish (CMP) process or a mechanical grinding process is performed to polish encapsulant 28, until the electrical connectors 26 are exposed. The respective process is illustrated as process 208 in the process flow 200 as shown in FIG. 26. Due to the planarization process, the top surfaces of electrical connectors 26 are substantially level (coplanar) with the top surface of encapsulant 28.

Figure 5:
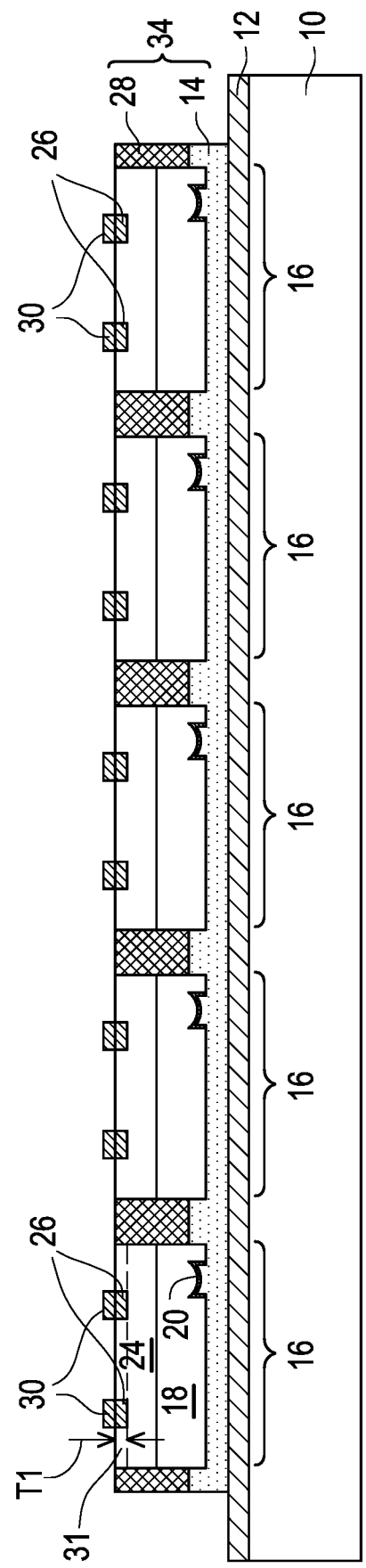
Figure 16:
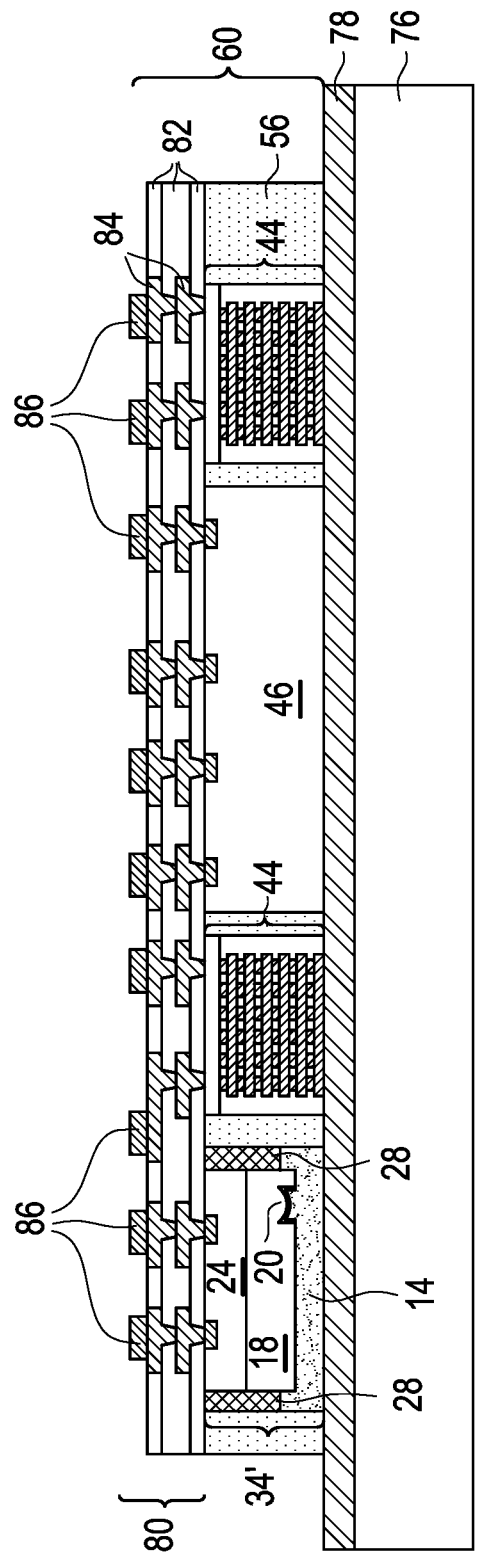

Next, as shown in FIG. 5, electrical connectors 30 are formed. The respective process is illustrated as process 210 in the process flow 200 as shown in FIG. 26. In accordance with some embodiments, electrical connectors 30 are formed directly on electrical connectors 26. In accordance with alternative embodiments, front-side redistribution structure (not shown) may be formed contacting optical dies 16, and electrically connect electrical connectors 30 to electrical connectors 26. For example, the front-side redistribution structure may be formed using essentially the same processes and materials as the formation of redistribution structure 80 as shown in FIG. 16. In accordance with some embodiments, electrical connectors 30 comprise bond pads, metal pillars (which may be micro-bumps), and/or the like, and may or may not include solder regions on the bond pads or metal pillars. Throughout the description, the structure over release film 12, which structure includes optical devices 16, encapsulant 28, DAF 14, and the electrical connectors 30, is referred to as reconstructed optical wafer 34.

In accordance with alternative embodiments, electrical connectors 26 protrude out of the top surfaces of the top dielectric layer of optical devices 16, and encapsulant 28 will extend into region 31 between electrical connectors 26 to encircle and contact electric connectors 26. In accordance with these embodiments, electrical connectors 30 may be or may not be formed. The thickness T1 of the portions of encapsulant in region 31 may be in the range between about 5 µm and about 50 µm, and may be in the range between about 10 µm and about 20 µm.

Figure 6:
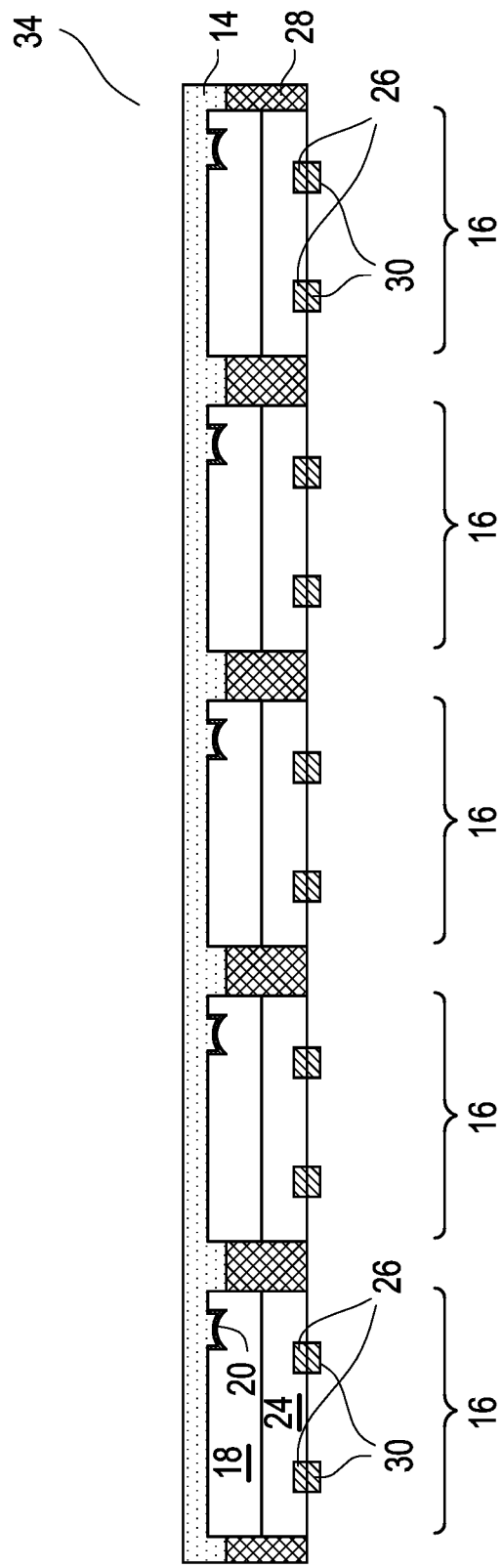

Next, reconstructed optical wafer 34 are de-bonded from carrier 10. The respective process is illustrated as process 212 in the process flow 200 as shown in FIG. 26. In accordance with some embodiments, to de-bond reconstructed optical wafer 34, a light beam such as a laser beam is projected on release film 12, and release film 12 is de-composed under the heat of the light beam. Reconstructed optical wafer 34 is thus released from carrier 10. The resulting reconstructed optical wafer 34 is shown in FIG. 6.

Figure 7:
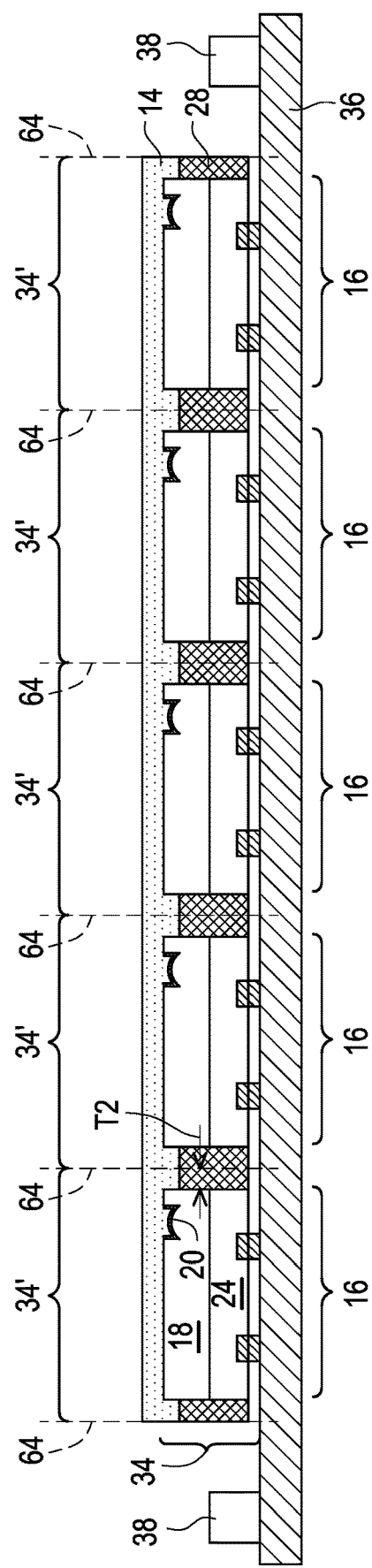

In a subsequent process, as shown in FIG. 7, reconstructed optical wafer 34 is placed on a dicing tape 36, which is fixed on frame 38. The respective process is illustrated as process 214 in the process flow 200 as shown in FIG. 26. Reconstructed optical wafer 34 is then singulated through a sawing process along scribe lines 64, so that reconstructed optical wafer 34 is separated into discrete packages 34'. The respective process is illustrated as process 216 in the process flow 200 as shown in FIG. 26. In accordance with some embodiments, the thickness T2 of encapsulant 28 on the sides of optical dies 16 may be in the range between about 5 μm and about 100 μm, and may be in the range between about 40 μm and about 60 μm.

Figure 8:
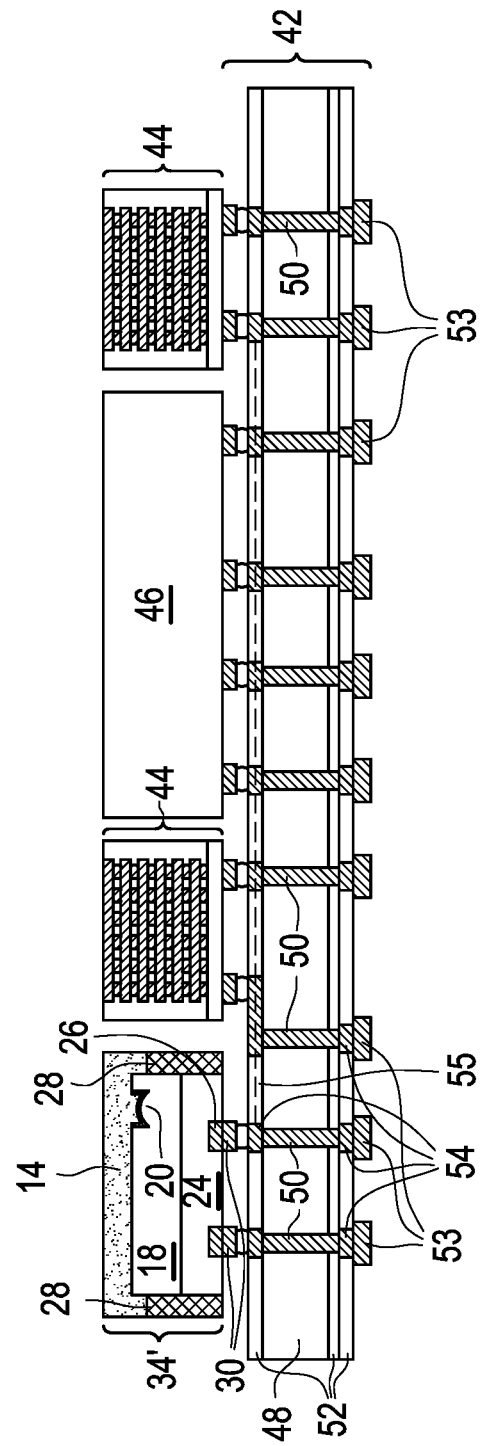

Referring to FIG. 8, package 34' is bonded to package component 42, which includes redistribution lines for routing electrical signals. Furthermore, package components 44 and 46 are bonded to package component 42. The respective process is illustrated as process 218 in the process flow 200 as shown in FIG. 26. The bonding may be through solder bonding, direct metal to metal bonding, hybrid bonding, or the like. Throughout the description, package 34' is also referred to in general as a package component.

Figure 22:
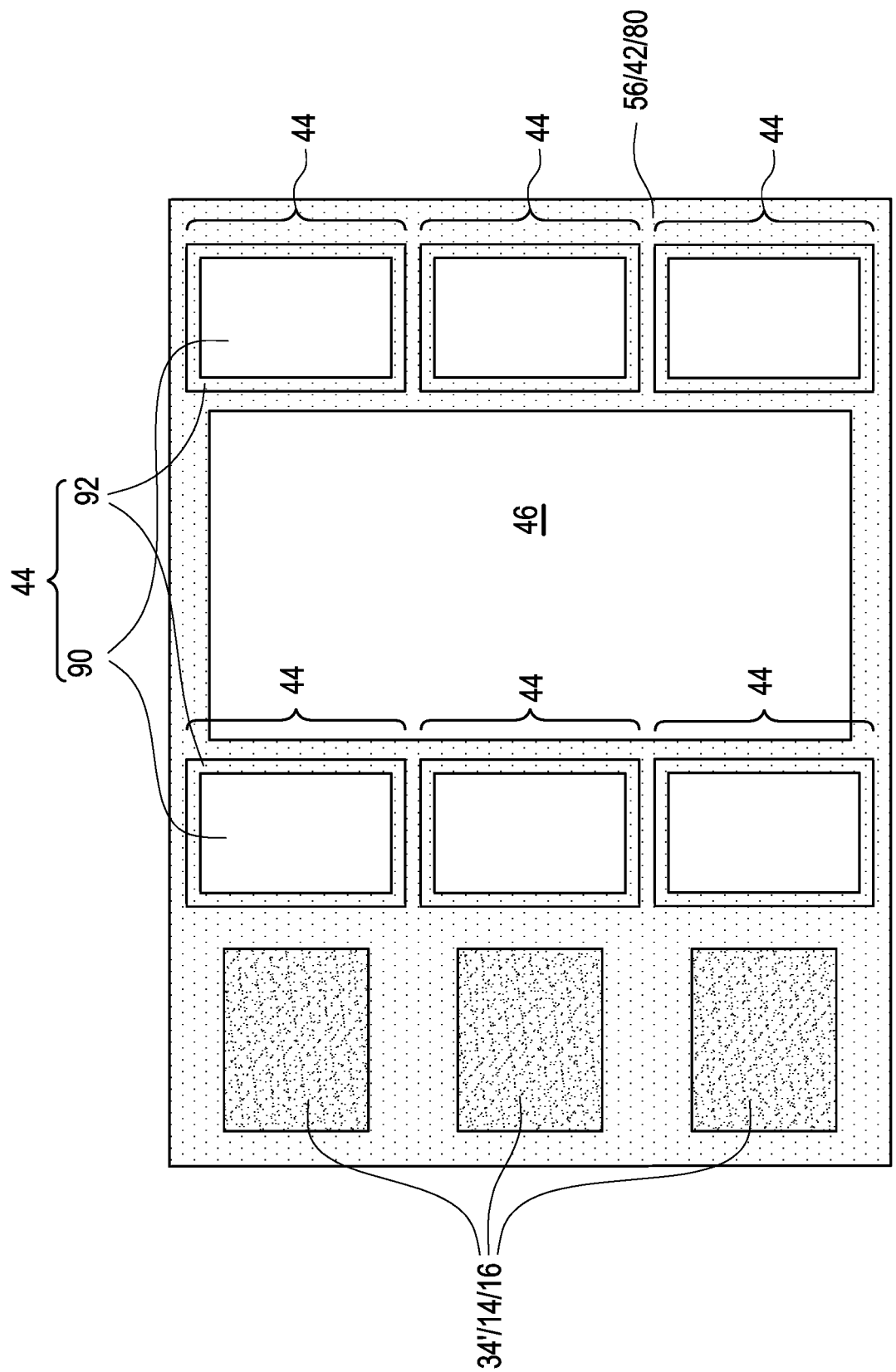
FIGS. 22 and 23 illustrate top views before and after removing a protection layer from a package including an optical die in accordance with some embodiments.
Figure 23:
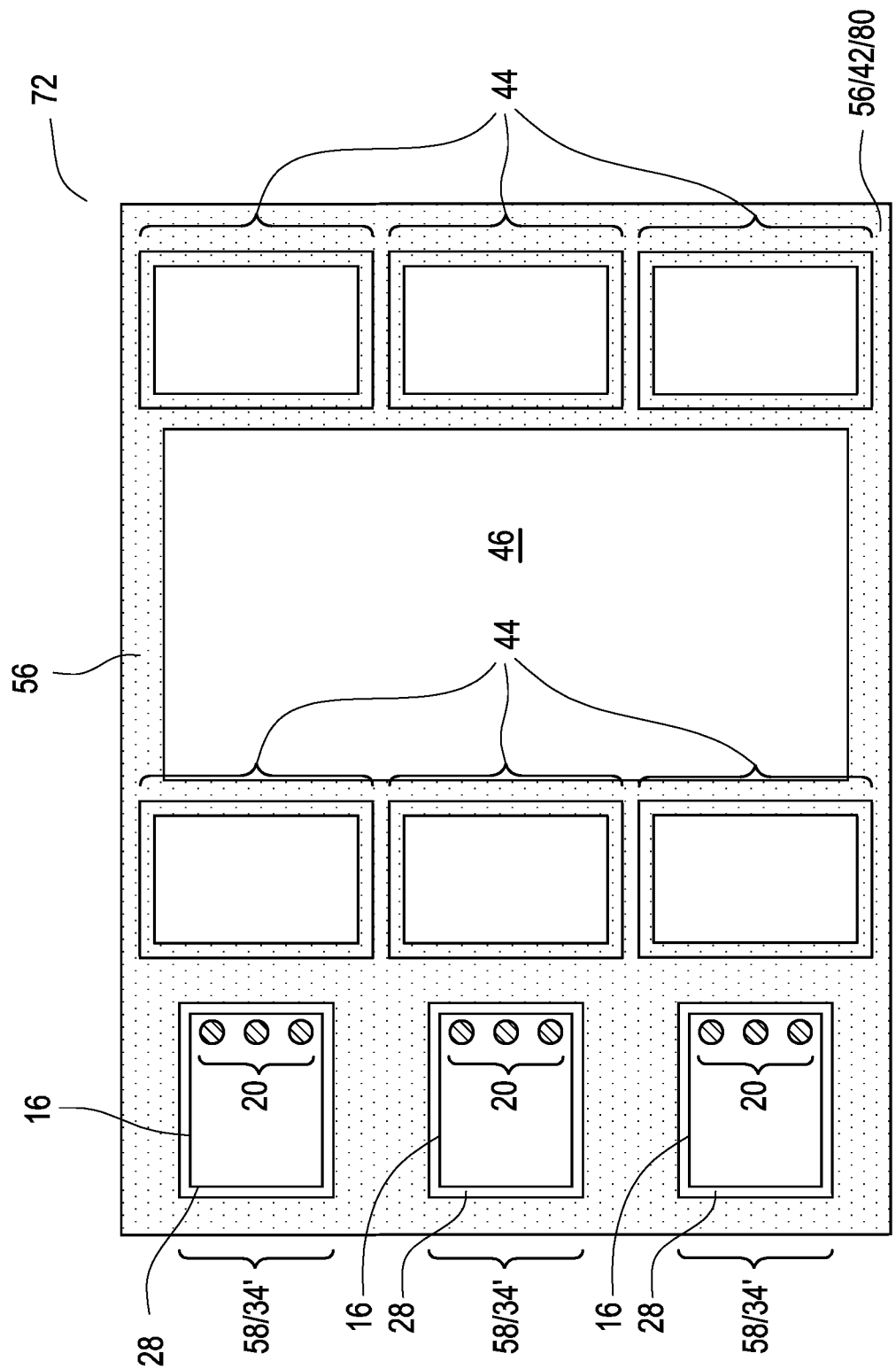

In accordance with some embodiments, package component 42 is an interposer, and hence is referred to as interposer 42 hereinafter, while it may also be another type of package component such as a package substrate, a package, or the like. Although FIG. 8 illustrates one group of package components 34', 44, and 46, the bonding may be at wafer level. For example, interposer 42 may be a part of an unsawed interposer wafer including a plurality of interposers identical to each other, with one being illustrated. There may be a plurality of groups of package components, each including package components 34', 44, and 46, bonding to package component 42. In addition, although one package 34' is shown in the cross-sectional view in FIG. 8, there may be a plurality of packages 34' in each group, as shown in FIGS. 22 and 23 as an example.

Interposer 42 may include substrate 48 and through-vias 50 penetrating through substrate 48. Substrate 48 may be a semiconductor substrate such as a silicon substrate. Dielectric layers 52 are formed on opposing sides of substrate 48, with conductive features 54 formed in dielectric layers 52. The conductive features 54 may include Redistribution Lines (RDLs), which include metal lines and metal pads. Electrical connectors 53 are formed at the bottom surface of interposer 42, and are electrically connected to package 34' and package components 44 and 46.

Furthermore, package 34' may be electrically connected to package components 44 and 46 through conductive features 54. For example, dashed line 55 is drawn to represent the electrical connections, which include RDLs, and the electrical connections electrically interconnect package components 34', 44, and 46.

In accordance with some embodiments, package components 44 and 46 may include a device die(s), a package(s) with a device die(s) packaged therein, a System-on-Chip (SoC) die including a plurality of integrated circuits (or device dies) integrated as a system, or the like. The device dies in package components 44 and 46 may be or may comprise logic dies, memory dies, input-output dies, Integrated Passive Devices (IPDs), or the like, or combinations thereof. For example, the logic dies in package components 44 and 46 may be Central Processing Unit (CPU) dies, Graphic Processing Unit (GPU) dies, mobile application dies, Micro Control Unit (MCU) dies, BaseBand (BB) dies, Application processor (AP) dies, or the like. The memory dies in package components 44 and 46 may include Static Random-Access Memory (SRAM) dies, Dynamic Random-Access Memory (DRAM) dies, or the like. The device dies in package components 44 and 46 may include semiconductor substrates and interconnect structures. In an example, package components 44 and 46 may include High-Bandwidth Memory (HBM) package 44 and processor die 46.

Package components 44 and 46 may also include electronic dies (E-dies), which include integrated circuits for interfacing with optical die 16, such as the circuits for controlling the operation of optical die 16. For example, package components 44 and 46 may include controllers, drivers, amplifiers, the like, or combinations thereof. In accordance with some embodiments, some of package components 44 and 46 may include Electronic Integrated Circuits (EIC s) that provide Serializer/Deserializer (SerDes) functionality. The corresponding package components 44 and 46 may act as parts of I/O interfaces between optical signals and electrical signals.

In accordance with some embodiments, underfills (not shown) are dispensed into the gaps between interposer 42 and the overlying package 34' and package components 44 and 46. In accordance with alternative embodiments, no underfill is dispensed, and encapsulant 56 (FIG. 9) may be a molding underfill that fills the gaps.

In accordance with alternative embodiments, a protection layer may be deposited or applied directly on the back surface of an optical wafer. The protection layer may include an organic material (such as a polymer) or an inorganic material. Alternatively, the protection layer may be formed of or comprise an inorganic material such as silicon nitride, silicon carbide, silicon oxynitride, or the like. The optical wafer and the protection layer thereon are then sawed directly as packages 34'. As a result, each of packages 34' includes an optical die 16 and a piece of the protection layer on the backside of the corresponding optical die 16. The resulting package 34' is essentially the same as what is shown in FIG. 8, except that encapsulant 28 does not exist, and the protection layer has its sidewalls flush with the corresponding sidewalls of optical die 16.

Figure 9:
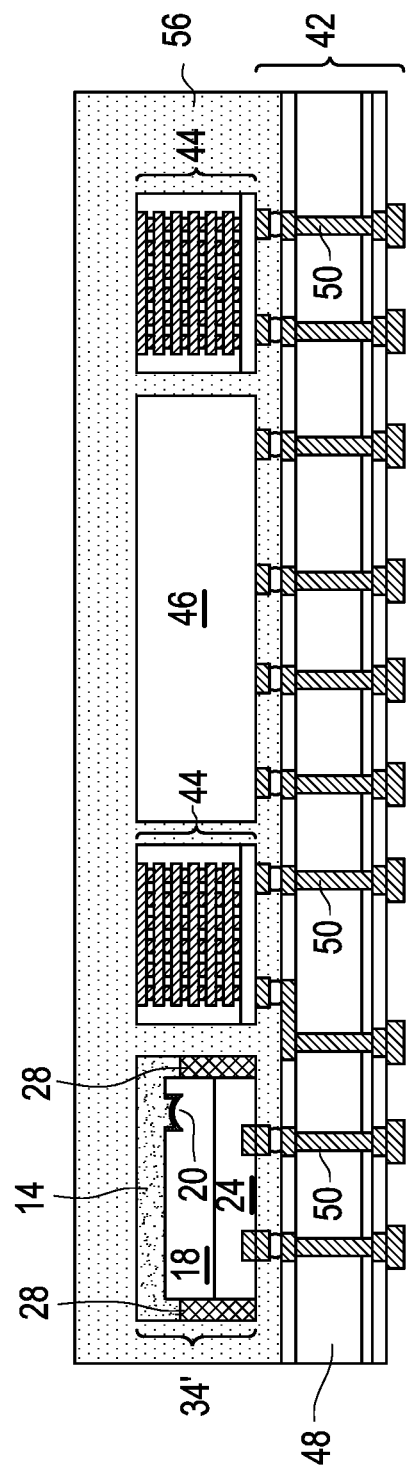

Next, as shown in FIG. 9, encapsulant 56 is dispensed to encapsulate package components 34', 44, and 46. The respective process is illustrated as process 220 in the process flow 200 as shown in FIG. 26. Encapsulant 56 fully covers package 34' and package components 44 and 46. Encapsulant 56 may include a molding compound, a molding underfill, an epoxy, and/or a resin. Encapsulant 56 may also include a base material (56A, FIGS. 24 and 25), which may be a polymer, a resin, an epoxy, or the like, and filler particles 56B in base material 56A. The filler particles may be dielectric particles of $SiO_2$, $Al_2O_3$, silica, or the like, and may have spherical shapes. Also, the spherical filler particles may have the same or different diameters. Encapsulant 56 has bottom surfaces contacting the top surfaces of DAF 14. The top surface of encapsulant 56 is higher than the top surfaces of package 34' and package components 44 and 46.

In accordance with some embodiments, encapsulant 56 is the same as encapsulant 28. For example, the base materials and the filler particles in encapsulants 28 and 56 may be the same as each other. In accordance with alternative embodiments, encapsulant 28 is different from encapsulant 56. For example, the base materials and/or the filler particles in encapsulant 28 may be different from that in encapsulant 56. Regardless of whether encapsulants 28 and 56 are the same as each other or different from each other, there will be distinguishable interfaces between encapsulants 28 and 56, as will be discussed referring to FIG. 24.

Figure 10:
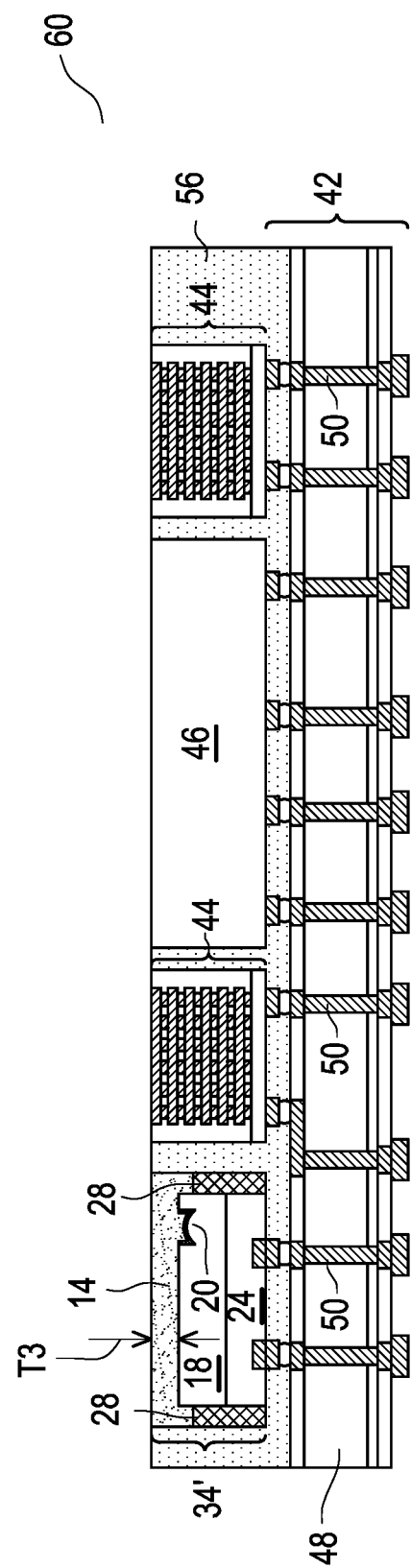

Subsequently, as shown in FIG. 10, a planarization process such as a CMP process or a mechanical grinding process is performed to polish encapsulant 56. The respective process is illustrated as process 222 in the process flow 200 as shown in FIG. 26. The planarization process may be performed until DAF 14 is exposed. A thin top portion of DAF 14 may also be removed. Also, when the planarization process is stopped, at least a portion of DAF 14 remains. Accordingly, optical die 16 is not polished, and the micro lens 20 therein is not subject to the damage caused by the planarization process. The remaining DAF 14 may have thickness T3. The thickness of the original DAF 14 and the planarization process (such as the over-polishing rate) are selected, so that the thickness T3 of the remaining DAF 14 (after planarization) is great enough to leave adequate process margin not to polish optical die 16. Accordingly, it is ensured that micro lens 20 is not damaged, regardless of whether micro lens 20 is recessed or protruding. In accordance with some embodiments, thickness T3 is greater than about 2 μm, and may be in the range between about 2 μm and about 50 μm.

Furthermore, the thickness of package components 44 and 46 are selected, so that these components are also not damaged by the planarization process. In accordance with some embodiments, as shown in FIG. 10, the top surfaces of package components 44 and 46 are exposed after the planarization process. In accordance with alternative embodiments, after the planarization process, some or all of package components 44 and 46 are embedded in encapsulant 56, and encapsulant 56 has a thin layer covering some or all of these package components.

In accordance with some embodiments in which package 34' does not include encapsulant 28, the sidewalls of optical die 16 and DAF 14 are in physical contact with encapsulant 56. A corresponding structure is shown in FIG. 25, except the recess 25 in FIG. 25 is still filled with DAF 14 in the process shown in FIG. 10.

Figure 11:
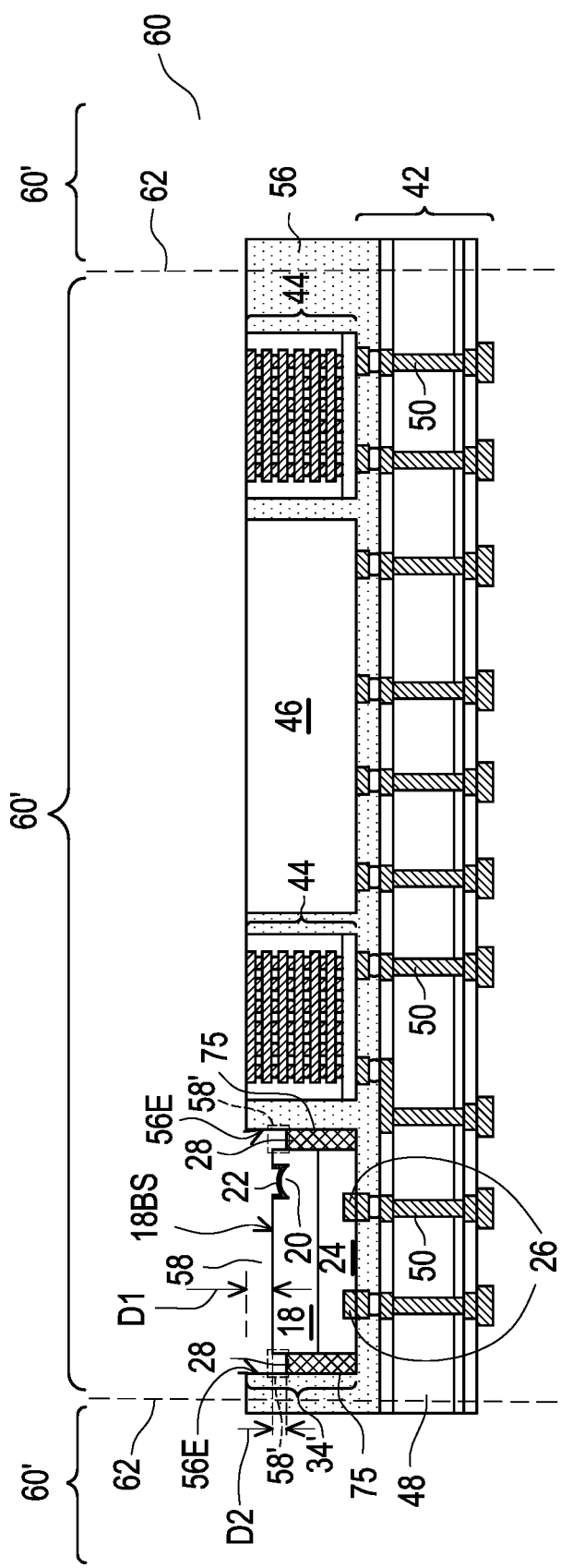

Next, DAF 14 is removed. The respective process is illustrated as process 224 in the process flow 200 as shown in FIG. 26. The resulting structure is shown in FIG. 11. The space left by the removed DAF 14 forms recess 58. Micro lens 20, (or protection layer 22 if it exists) is thus exposed to recess 58. The etching may be performed through a dry etching process or a wet etching process. The etching chemical is selected, so that it does not attack encapsulants 28 and 56, and does not attack substrate 18 and protection layer 22. In accordance with some embodiments, the removal of DAF 14 is performed through a wet etching process, for example, using dimethyl sulfoxide, tetramethylazanium hydroxide, or the like as an etching chemical.

In accordance with some embodiments, depth D1 of recess 58 is greater than about 2 μm, and may be in the range between about 2 μm and about 50 μm. The edges 56E of encapsulant 56 facing recess 58 may be straight and vertically aligned to edges of package 34'. For example, in accordance with some embodiments in which package 34' includes encapsulant 28, edges 56E of encapsulant 56 are flush with the outer edges of encapsulant 28. In accordance with alternative embodiments in which package 34' does not include encapsulant 28, edges 56E of encapsulant 56 are flush with the corresponding edges of optical die 16.

Furthermore, recess 58 may include some portions extending below the top surface 18BS (the back surface) of optical die 16. The portions of recess 58 lower than the top surface 18BS are denoted as recesses 58' hereinafter. The depth D2 of recesses 58' depends on how much optical die 16 was pressed into DAF 14 (as shown in FIG. 2). In accordance with some embodiments, depth D2 is greater than about 1 μm, and may be in the range between about 1 μm and about 50 μm. When viewed from the top of the structure shown in FIG. 11, recesses 58' may form a recess ring encircling optical die 16. Furthermore, the bottoms of recesses 58' are determined by the shape of the DAF 14, as shown in FIG. 2, and may be concave and rounded, as shown by dashed lines 59 in FIG. 24. When being concave and rounded, some outer portions of the bottoms 59 of recesses 58' may be increasingly lower than the respective inner portions. This is caused by the processes shown in FIGS. 2 and 7.

Throughout the description, the structure shown in FIG. 11 is referred to as reconstructed wafer 60. Reconstructed wafer 60 includes a plurality of identical groups of package components, each including package components 34', and may include package(s) 44 and 46 in an example. A singulation process may then be performed along scribe lines 62 to separate reconstructed wafer 60 into a plurality of packages 60'. The respective process is illustrated as process 226 in the process flow 200 as shown in FIG. 26.

Figure 12:
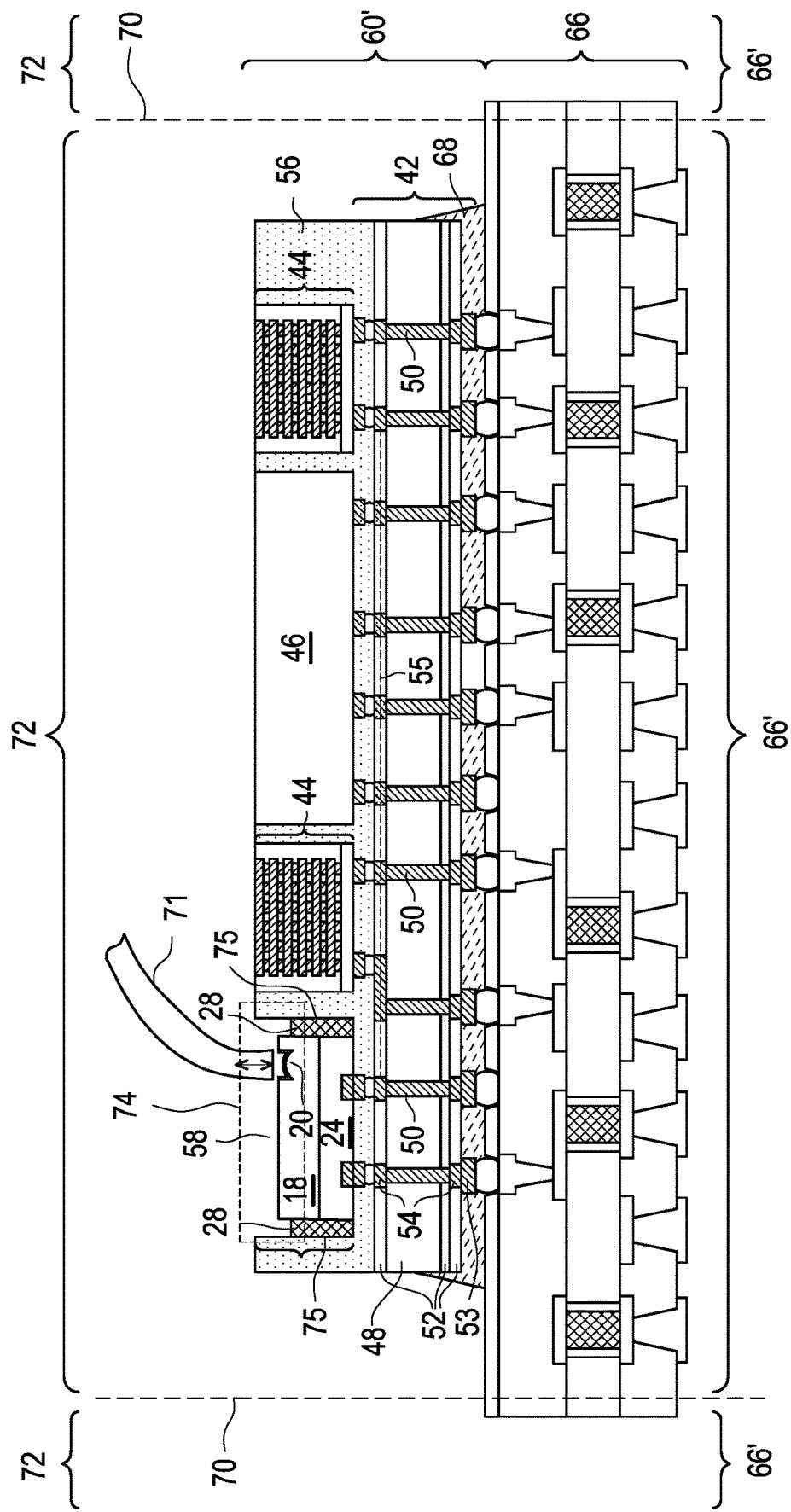

FIG. 12 illustrates the bonding of package 60' onto another package component 66. The respective process is illustrated as process 228 in the process flow 200 as shown in FIG. 26. In accordance with some embodiments, package component 66 is a wafer-level component, which includes a plurality of identical package components 66' therein. For example, package component 66 may be a package substrate strip, which includes a plurality of package substrates 66' therein. Package substrates 66' may be cored package substrates including cores, or may be core-less package substrates that do not have cores therein. The cored package substrates may include organic substrates or ceramic substrates. In accordance with alternative embodiments, package component 66 is at die-level. Package component 66 may be free from active devices such as transistors and diodes therein. Package component 66 may also be free from (or may include) passive devices such as capacitors, inductors, resistors, or the like therein. Underfill 68 is dispensed into the gap between packages 60' and the corresponding package components 66.

A singulation process is performed along scribe lines 70. Package 72 is thus formed. In accordance with alternative embodiments, the bonding as shown in 12 is at die-level, with a package 60' bonded to a discrete package component 66'. An optical device such as an optical fiber 71 may then be attached to package 72, and may be optically coupled to micro lens 20. Optical fiber 71 may extend into recess 58, or may remain outside of recess 58. Recess 58 may be an air gap, or may be filled with a transparent optical glue.

Figure 24:
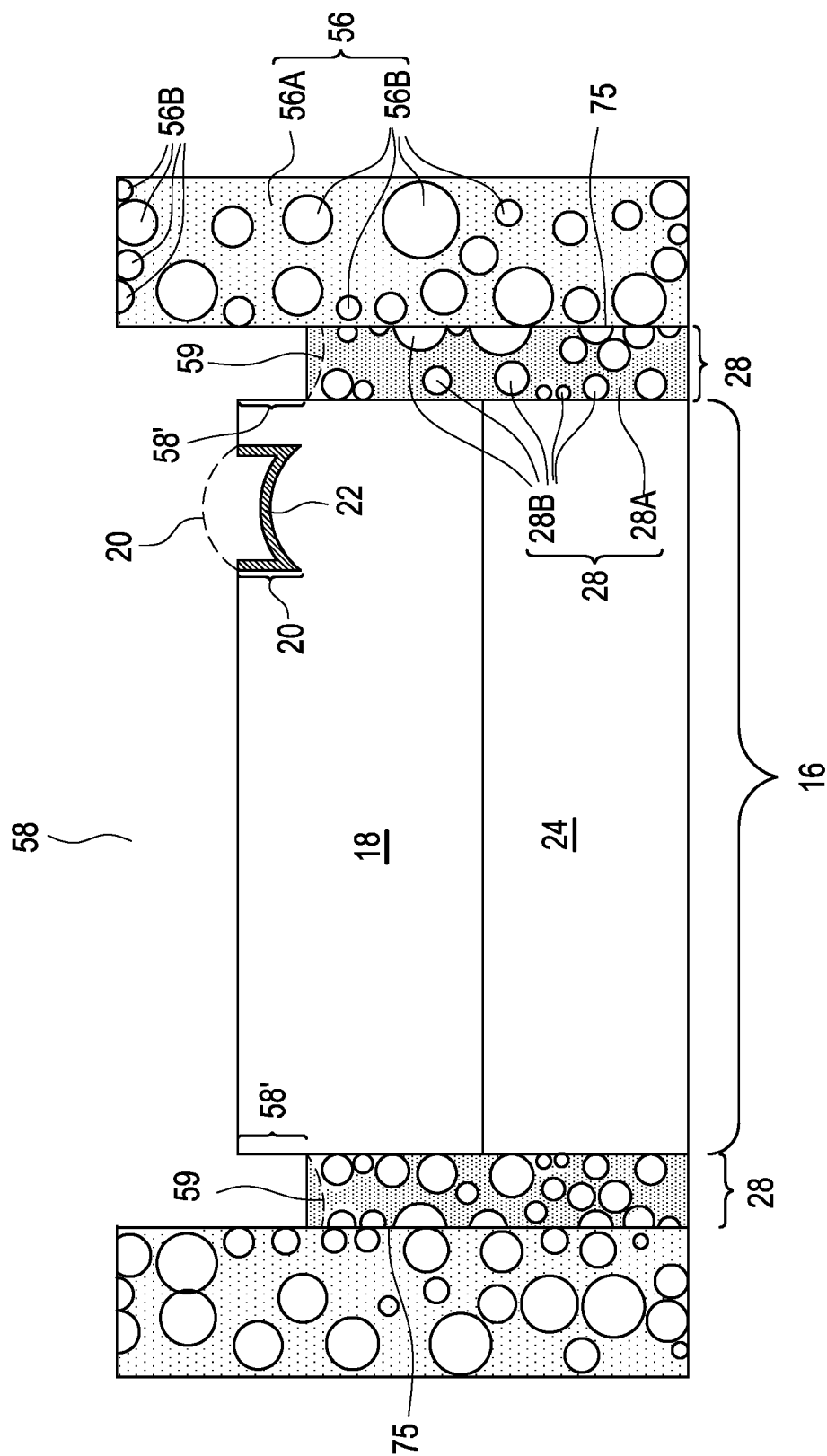
FIGS. 24 and 25 illustrate magnified views of portions of packages in accordance with some embodiments.

FIG. 24 illustrates a magnified view of a portion of package 60' in accordance with some embodiments. The illustrated portion is in region 74 in FIG. 12. Due to the singulation process as shown in FIG. 7, encapsulant 28 is sawed through, and hence as shown in FIGS. 12 and 24, distinguishable interfaces 75 are formed between encapsulants 28 and 56. For example, as shown in FIG. 24, the filler particles 28B in encapsulant 28 are cut, and some filler particles 28B become partial particles including planar surfaces that are in contact with encapsulant 56. The filler particles 56B of encapsulant 56 at the surfaces facing recess 58 and contacting encapsulant 28, on the other hand, are not cut, and are still spherical. At the top surface of encapsulant 56, however, the corresponding filler particles 56B may be partial particles due to the planarization process as shown in FIG. 10.

FIG. 25 illustrates the magnified view of a portion of package 60' in accordance with alternative embodiments. These embodiments are similar to the embodiments as in FIG. 24, except that optical die 16 is not encapsulated in another encapsulant (encapsulant 28 in FIG. 24) when it is bonded (the process shown in FIG. 8) to package component 42. Accordingly, as shown in FIG. 25, encapsulant 56 is in physical contact with the sidewalls of substrate 18, and the sidewalls of encapsulant 56 facing recess 58 are vertically aligned to the sidewalls of optical die 16. The filler particles 56B at the sidewalls facing recess 58 and the filler particles 56B contacting optical die 16 are spherical. At the top surface of encapsulant 56, the corresponding filler particles 56B may be partial particles due to the planarization process as shown in FIG. 10.

FIGS. 13 through 19 illustrate the cross-sectional views of intermediate stages in the formation of a package in accordance with alternative embodiments of the present disclosure. Unless specified otherwise, the materials and the formation processes of the components in these embodiments are essentially the same as the like components denoted by like reference numerals in the preceding embodiments shown in FIGS. 1 through 12. The details regarding the formation processes and the materials of the components shown in FIGS. 13 through 19 may thus be found in the discussion of the preceding embodiments.

Figure 27:
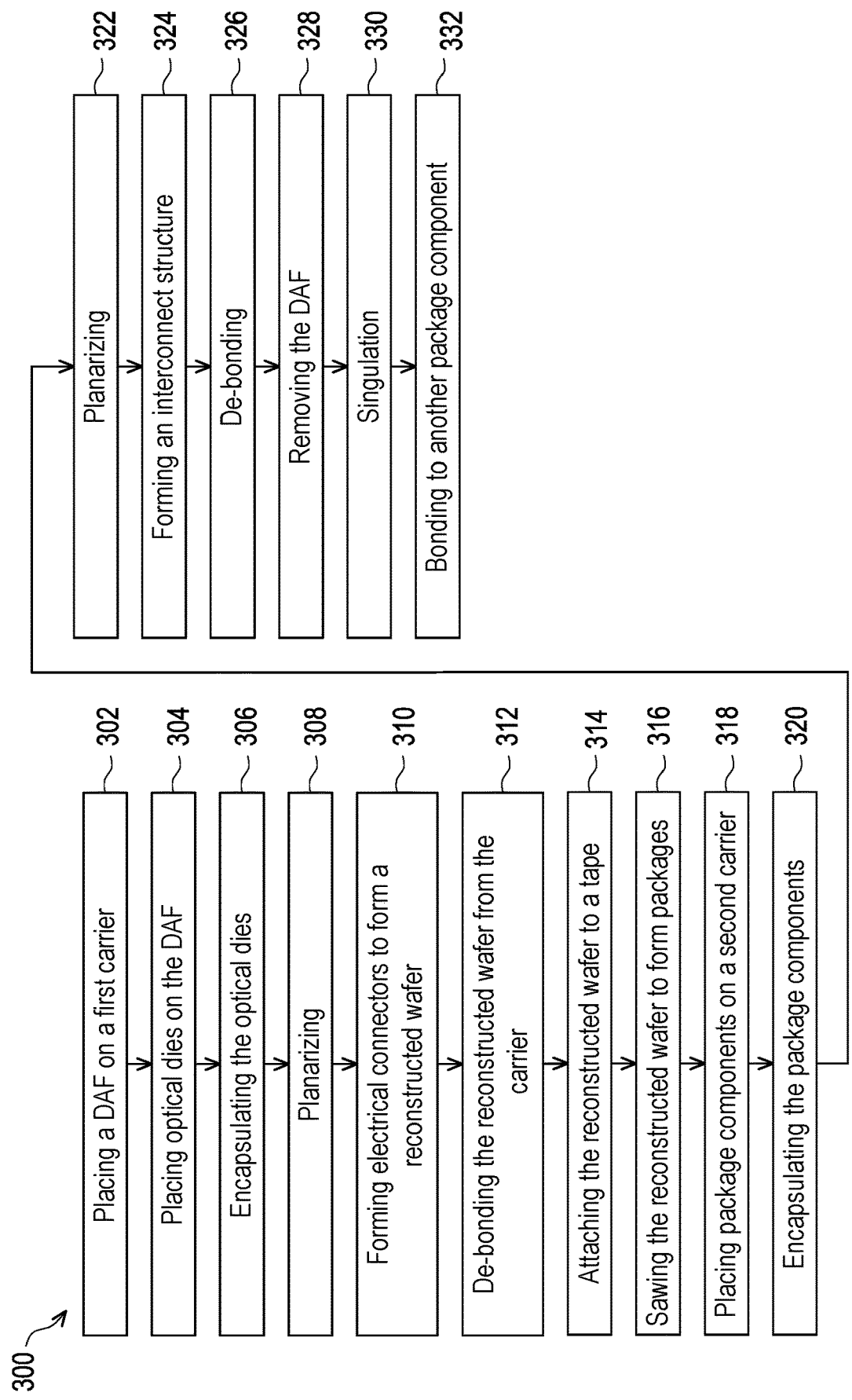
FIG. 27 illustrates a process flow for forming a package including an optical die and additional dies in accordance with alternative embodiments.

The initial steps of these embodiments are essentially the same as shown in FIGS. 1 through 7. The respective processes are illustrated as process 302 through 316 in the process flow 300 as shown in FIG. 27. Package 34' as shown in FIG. 7 are thus formed. In accordance with alternative embodiments, as discussed in preceding paragraphs, package 34' does not include the encapsulant 28, and the corresponding protection layer may comprise DAF or some other materials such as inorganic materials.

Figure 13:
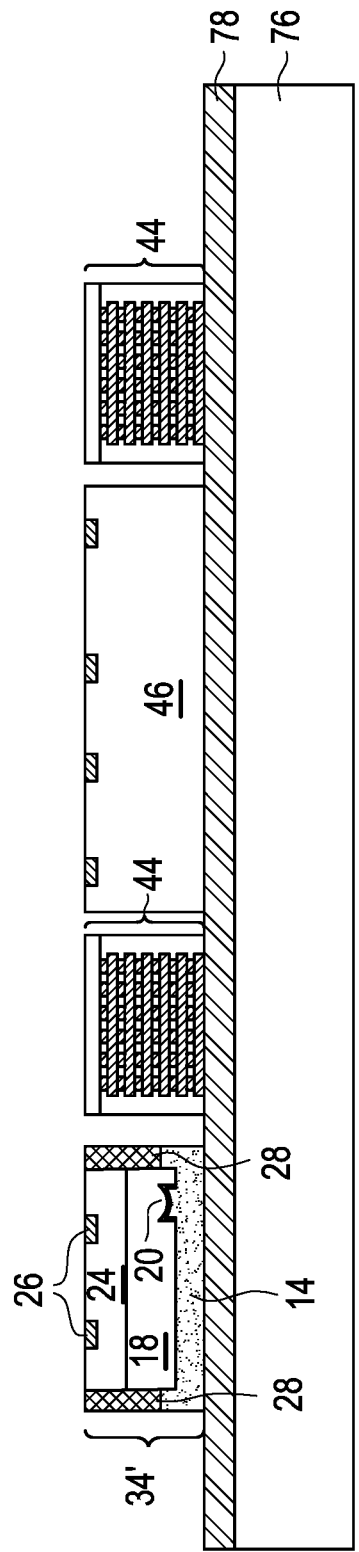
FIGS. 13-19 illustrate the cross-sectional views of intermediate stages in the formation of a package including an optical die and additional dies in accordance with some embodiments.

Next, as shown in FIG. 13, package 34' (also referred to as a package component) and package components 44 and 46 are placed over carrier 76. The respective process is illustrated as process 318 in the process flow 300 as shown in FIG. 27. In accordance with some embodiments, there are a plurality of identical groups of package components 34', 44, and 46 being placed over carrier 76. Carrier 76 may be a glass carrier, an organic carrier, or the like. Release film 78 is coated on carrier 76 for attaching optical dies to carrier 76. There may be, or may not be, a blanket DAF (not shown) over release film 78, and package components 34', 44, and 46 are placed over the blanket DAF (if used). Release film 78 may be formed of a polymer-based material (such as an LTHC material), which may be removed in subsequently processes. Package components 34', 44, and 46 have their front surface (the surface having electrical connectors) facing up.

Figure 14:
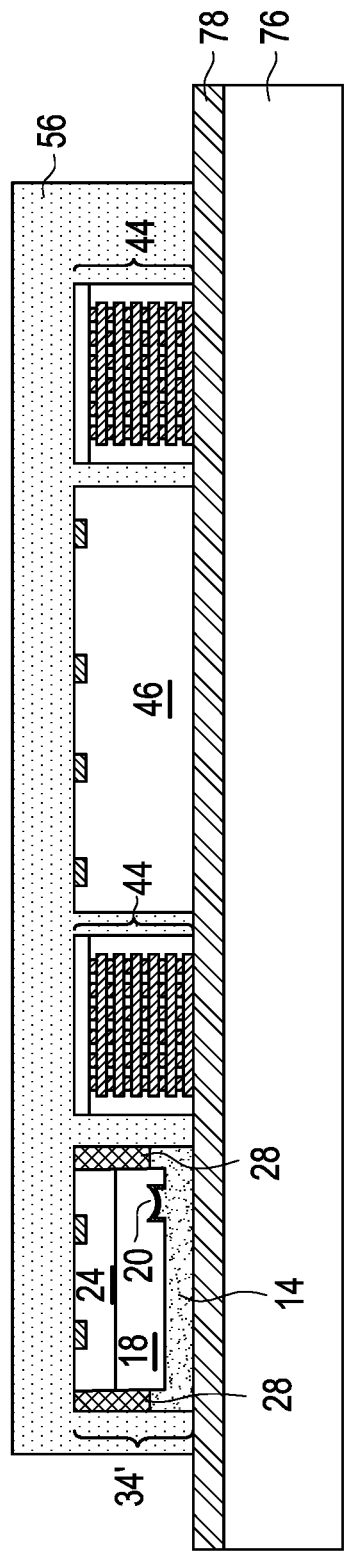

Next, as shown in FIG. 14, package components 34', 44, and 46 are encapsulated in encapsulant 56, which may include a molding compound, a molding underfill, an epoxy, and/or a resin. The respective process is illustrated as process 320 in the process flow 300 as shown in FIG. 27. The molding compound or molding underfill may include a base material 56A (FIGS. 24 and 25), which may be a polymer, a resin, an epoxy, or the like, and filler particles 56B in base material 56A.

Figure 15:
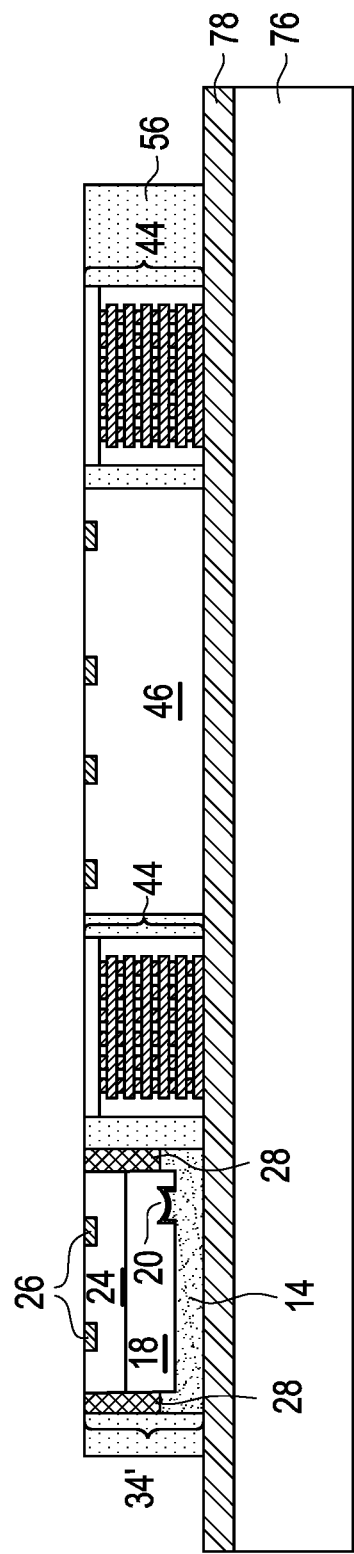

FIG. 15 illustrates the planarization process to reveal the electrical connectors 26 of package component 34' and the electrical connectors (not shown) of package components 44 and 46. The respective process is illustrated as process 322 in the process flow 300 as shown in FIG. 27. Next, as shown in FIG. 16, interconnect structure 80 is formed. The respective process is illustrated as process 324 in the process flow 300 as shown in FIG. 27. Interconnect structure 80 includes dielectric layers 82 and Redistribution Lines (RDLs) 84 in dielectric layers 82. RDLs 84 are connected to, and may interconnect, package components 34', 44, and 46. RDLs 84 may include copper, titanium, nickel, or the like.

In an example formation process of a dielectric layer 82 and the corresponding RDLs 84, a dielectric layer 82 is formed first, for example, through dispensing or deposition. In accordance with some embodiments, the dielectric layer 82 is formed of or comprises a polymer such as PBO, polyimide, benzocyclobutene (BCB), or the like. The dielectric layer 82 is then patterned to reveal the underlying conductive features, which may include the electrical connectors of package components 34', 44, and 46, or the underlying RDLs. In accordance with some embodiment in which the dielectric layer 82 is formed of a photo sensitive material such as PBO or polyimide, the patterning may involve a photo exposure process using a lithography mask (not shown) to light-expose the dielectric layer 82, and then developing the dielectric layer 82. In accordance with alternative embodiments of the present disclosure, dielectric layer 82 is formed of an inorganic dielectric material such as silicon nitride, silicon oxide, or the like. The corresponding formation process may include Chemical Vapor Deposition (CVD), Atomic Layer Deposition (ALD), Plasma-Enhanced Chemical Vapor Deposition (PECVD), or other applicable deposition processes, followed by an etching process.

Electrical connectors 86 are formed over RDLs 84. Electrical connectors 86 may be formed of or comprise metal pillars (micro-bumps), solder regions, or the like. Reconstructed wafer 60 is thus formed. Different from the reconstructed wafer 60 as shown in FIG. 11 in which package components 34', 44 and 46 are bonded to package component 42, interconnect structure 80 is formed directly from package components 34', 44, and 46, and may be formed as a fan-out structure.

Figure 17:
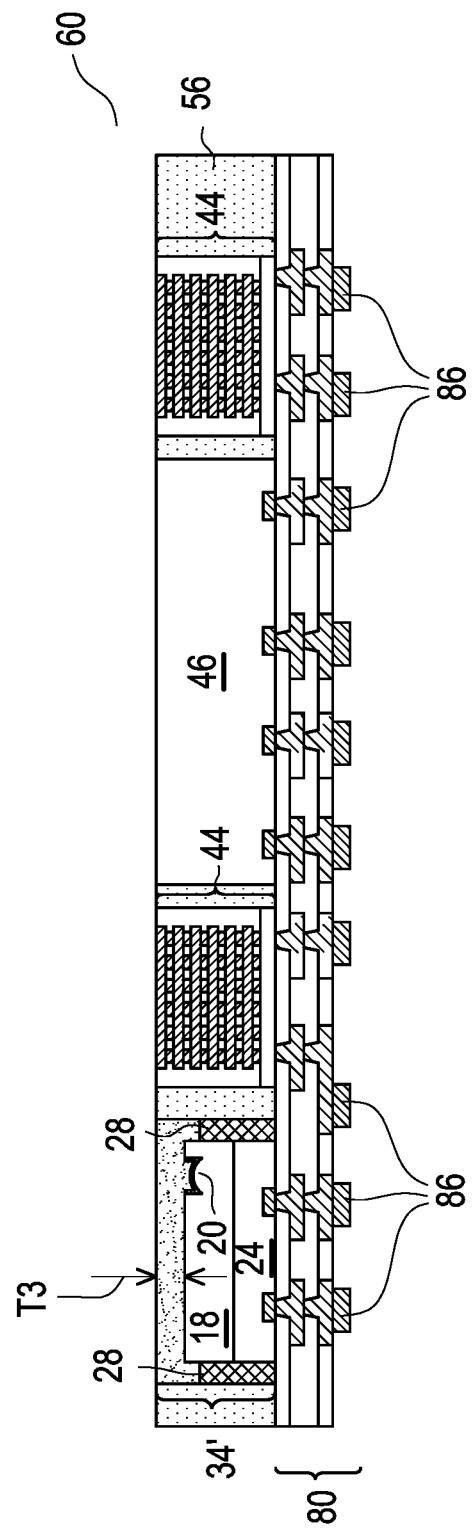

Next, reconstructed wafer 60 may be de-bonded from carrier 76. The respective process is illustrated as process 326 in the process flow 300 as shown in FIG. 27. In accordance with some embodiments, a light beam such as a laser beam is projected on release film 78, and release film 78 is de-composed under the heat of the light beam. Reconstructed wafer 60 is thus released from carrier 76. The resulting reconstructed wafer 60 is shown in FIG. 17.

Figure 18:
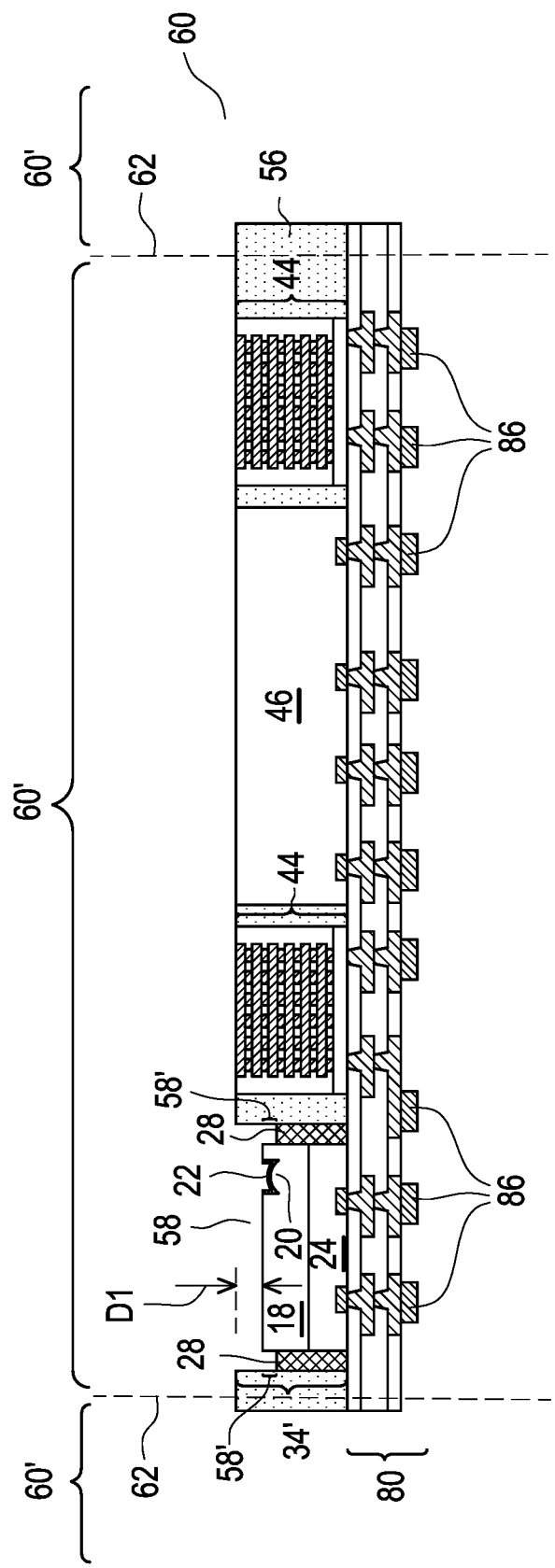

Next, DAF 14 is removed. The respective process is illustrated as process 328 in the process flow 300 as shown in FIG. 27. The resulting structure is shown in FIG. 18. The space left by the removed DAF 14 forms recess 58. Micro lens 20 (or protection layer 22 if it exists) is thus exposed to recess 58. Depth D1 of recess 58 is equal to the thickness of DAF 14, and may be greater than about 2 μm, for example, in the range between about 2 μm and about 50 μm. Recess 58 may extend below the top surface (the back surface) of optical die 16 to form recess 58', which may be a recess ring encircling optical die 16. Some details of recess 58' is also shown in FIG. 24. Reconstructed wafer 60 may be singulated into discrete packages 60' along scribe lines 62. The respective process is illustrated as process 330 in the process flow 300 as shown in FIG. 27.

Figure 19:
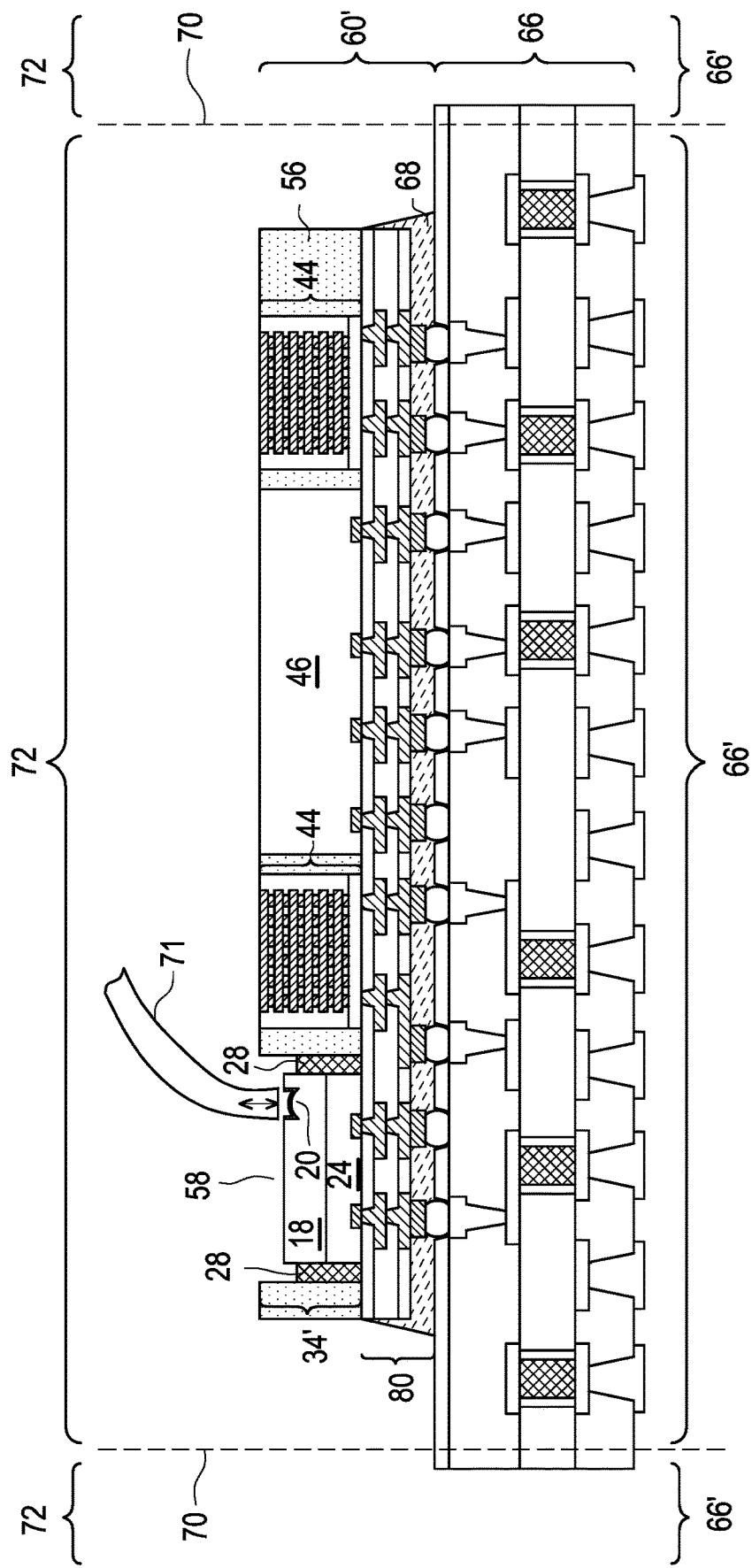

FIG. 19 illustrates the bonding of package 60' onto another package component 66, which may be a wafer-level component or a die-level component, and may be a package substrate, an interposer (for example, including a semiconductor substrate and through-vias therein), a package, a package including an interposer bonded on a package substrate, or the like. The respective process is illustrated as process 332 in the process flow 300 as shown in FIG. 27.

Underfill 68 is dispensed into the gap between package 60' and package component 66'. In accordance with some embodiments in which package component 66 is at wafer-level, a singulation process is performed along scribe lines 70. Package 72 is thus formed. An optical device such as an optical fiber 71 may then be attached to package 72, and may be optically coupled to micro lens 20. Optical fiber 71 may extend into recess 58, or may remain outside of recess 58.

Figure 20:
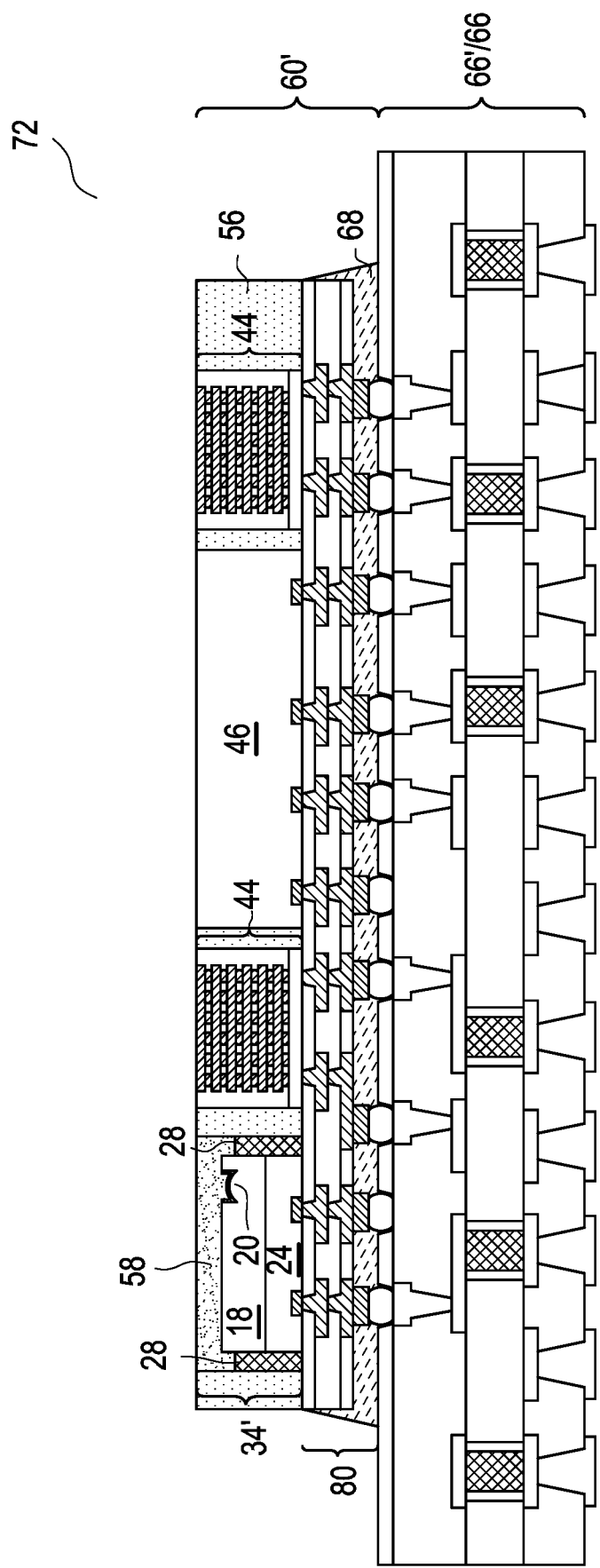
FIG. 20 illustrates an intermediate structure in the formation of a package including an optical die and additional dies in accordance with some embodiments.

In accordance with some embodiments, as shown in FIGS. 10-12 and FIGS. 17-19, DAF 14 (or other types of protection layer) are removed when they are in the reconstructed wafer 60, and before the singulation process and bonding to package component 66. In accordance with alternative embodiments, DAF 14 may be removed at a later stage to reduce the possibility of damaging lens 20. For example, FIG. 20 illustrates package 72 that still includes DAF 14 therein. The protection layer(s)/DAF 14 may be removed either before or after the singulation process to separate package components 66 into discrete packages 72.

Figure 21:
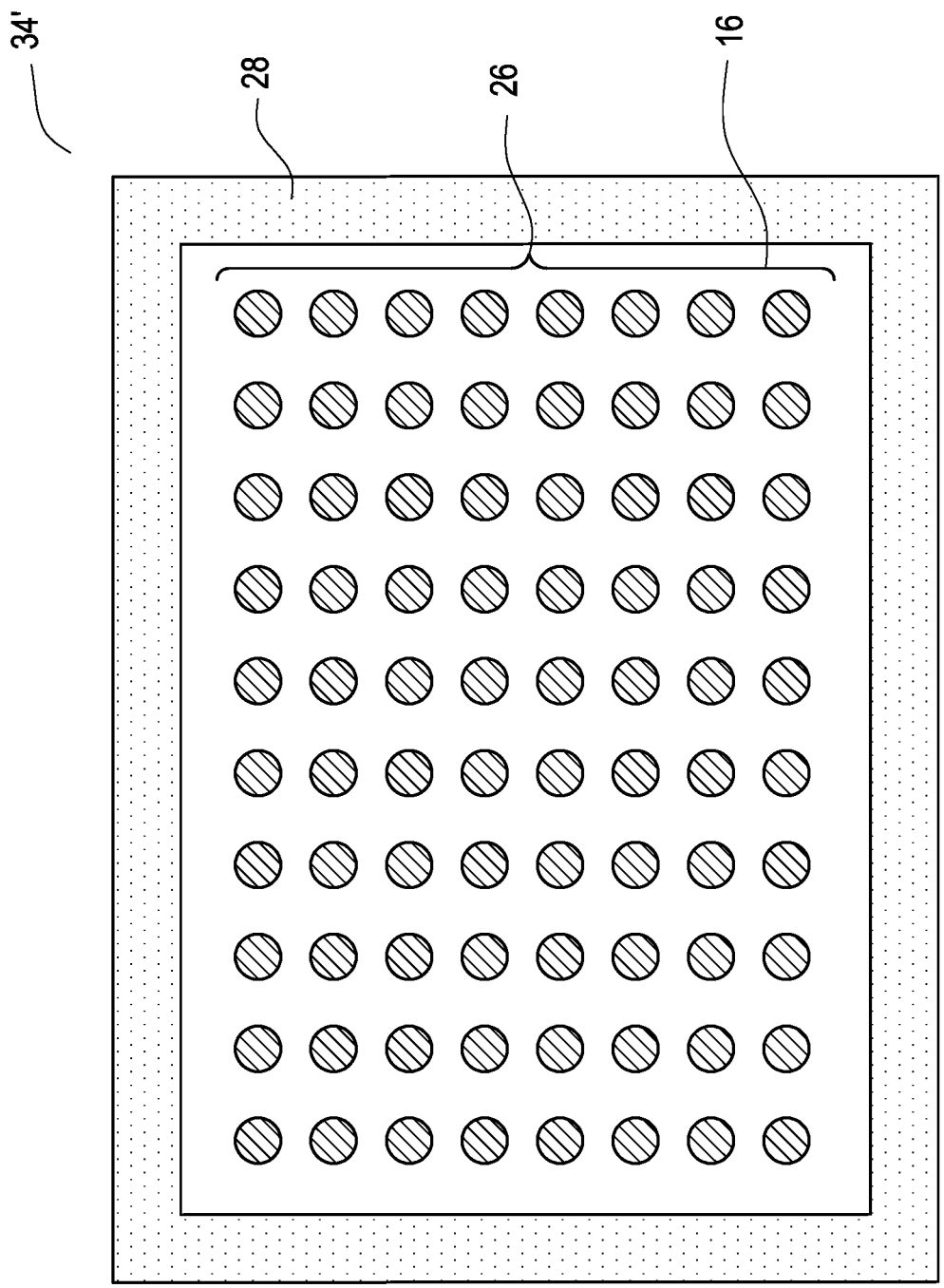
FIG. 21 illustrates a bottom view of a package including an optical die in accordance with some embodiments.

FIG. 21 illustrates a bottom view of package 34' (as shown in FIGS. 10 and 11) in accordance with some embodiments. There may be a plurality of electrical connectors 26 arranged as an array, which are used to electrically connect to other package components 42, 44, and 46 as shown in FIGS. 12 and 19. The bottom area of optical die 16 may be in the range between about 5 mm$^2$ and about 400 mm$^2$.

FIG. 22 illustrates a top view of the structure shown in FIGS. 10 and 17. In accordance with some embodiments, a plurality of package components 46, which may be HBMs, are placed on package component 42 (or interconnect structure 80) and encapsulated in encapsulant 56. Each of the package components 46 may include a plurality of stacked device dies 90 encapsulated in encapsulant 92. A plurality of DAFs 14 are inside, and are encircled by, encapsulant 56. DAFs 14 cover the underlying packages 34'.

FIG. 23 illustrates a top view of the package 60' shown in FIGS. 11 and 18, in which the protection layers 14 as shown in FIG. 21 have been removed. Accordingly, recesses 58 are formed, with packages 34' and the micro lenses 20 therein being revealed. In accordance with some embodiments, micro lenses 20 are used to connect to optical fibers, and there may be a single one or a few micro lenses. It is appreciated that micro lenses 20 may be at any location in optical die 16 (in the top view). In accordance with other embodiments, micro lenses 20 are arranged as an array, and are used for capturing images.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. In conventional processes for forming packages including optical dies and additional package components such as high-performance computing dies, the planarization process is used to reveal the optical dies, and the optical dies are also polished. The possibility of damaging micro lenses (which were recessed) was high. In accordance with the embodiments of the present disclosure, by forming protection layers such as DAFs on optical dies and removing the protection layers after the planarization process, the protection layers (rather than the optical dies) are subject to planarization processes. The micro lenses in the optical dies are thus protected from the damage that may occur in the planarization processes.

In accordance with some embodiments of the present disclosure, a method comprises forming a first package comprising an optical die and a protection layer attached to the optical die, wherein the optical die comprises a micro lens, and wherein the protection layer and the micro lens are on a same side of the optical die; encapsulating the first package in a first encapsulant; planarizing the first encapsulant to reveal the protection layer; and removing the protection layer to form a recess in the first encapsulant, wherein the optical die is underlying the recess, with the micro lens facing the recess.

In an embodiment, the forming the first package comprises adhering the optical die to a die-attach film. In an embodiment, the method further comprises sawing an optical wafer into a plurality of optical dies, with the optical die being one of the plurality of optical dies. In an embodiment, the method further comprises encapsulating the optical die in a second encapsulant; planarizing the second encapsulant to reveal electrical connectors in the optical die; and sawing the second encapsulant to form the first package. In an embodiment, the optical die comprises a semiconductor substrate, and wherein the micro lens is recessed into the semiconductor substrate from a surface of the semiconductor substrate. In an embodiment, the optical die comprises a semiconductor substrate, and wherein the micro lens protrudes out of a back surface of the semiconductor substrate. In an embodiment, a package component is also encapsulated in the first encapsulant, and wherein after the first encapsulant is planarized, the package component is revealed, and the optical die is covered by the protection layer. In an embodiment, the method further comprises bonding the first package to a package component, wherein the first encapsulant is applied on the package component, and the method further comprises sawing the package component and the first encapsulant to form a second package. In an embodiment, after the protection layer is removed, a portion of the recess extends into the first encapsulant, and extends to a level lower than a back surface of the optical die. In an embodiment, the portion of the recess extending into the first encapsulant forms a recess ring encircling the optical die.

In accordance with some embodiments of the present disclosure, a package comprises a first package component comprising a plurality of redistribution lines therein; a second package component over and bonding to the first package component, wherein the second package component comprises an optical die comprising a micro lens, wherein the micro lens faces up; and a first encapsulant over the first package component and encapsulating the optical die therein, wherein a first top surface of the optical die is recessed lower than a second top surface of the first encapsulant to form a recess, and wherein the optical die is exposed to the recess.

In an embodiment, the recess extends laterally beyond edges of the optical die, and wherein portions of the recess extend lower than the first top surface of the optical die. In an embodiment, the second package component further comprises a second encapsulant encircling the optical die. In an embodiment, the second encapsulant encircling the optical die comprises curved and concave top surfaces. In an embodiment, first edges of some portions of the first encapsulant facing the recess are vertically aligned to second edges of the optical die. In an embodiment, the package further comprises an optical fiber facing the micro lens, wherein the optical fiber is configured to optically couple to the optical die. In an embodiment, the package further comprises a third package component over and bonding to the first package component, wherein an additional top surface of the third package component is coplanar with the second top surface of the first encapsulant.

In accordance with some embodiments of the present disclosure, a package comprises an optical die comprising a semiconductor substrate; and a micro lens at a top surface of the semiconductor substrate; and a first interconnect structure underlying the semiconductor substrate; a package component comprising a device die therein; a first molding compound molding the optical die and the package component therein, wherein a first top surface of the optical die is recessed lower than both of a second top surface of the first molding compound and a third top surface of the package component; and an interconnect structure underlying and bonding to the optical die and the package component. In an embodiment, the first top surface of the optical die is directly underlying a recess in the first molding compound, and wherein the first molding compound facing the recess comprises vertical and straight edges. In an embodiment, the package further comprises a second molding compound encircling the optical die, wherein the second molding compound is in the first molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first package comprising an optical die and a protection layer attached to the optical die, wherein the optical die comprises a micro lens, and wherein the protection layer and the micro lens are on a same side of the optical die;
    encapsulating the first package in a first encapsulant;
    planarizing the first encapsulant to reveal the protection layer; and
    removing the protection layer to form a recess in the first encapsulant, wherein the optical die is underlying the recess, with the micro lens facing the recess, wherein after the protection layer is removed, a portion of the recess extends into the first encapsulant, and extends to a level lower than a back surface of the optical die, and wherein the portion of the recess extending into the first encapsulant forms a recess ring encircling the optical die.

2. The method of claim 1, wherein the forming the first package comprises adhering the optical die to a die-attach film.

3. The method of claim 2 further comprising:
    sawing an optical wafer into a plurality of optical dies, with the optical die being one of the plurality of optical dies.

4. The method of claim 3 further comprising:
    encapsulating the optical die in a second encapsulant;
    planarizing the second encapsulant to reveal electrical connectors in the optical die; and
    sawing the second encapsulant to form the first package.

5. The method of claim 1, wherein the optical die comprises a semiconductor substrate, and wherein the micro lens is recessed into the semiconductor substrate from a surface of the semiconductor substrate.

6. The method of claim 1, wherein the optical die comprises a semiconductor substrate, and wherein the micro lens protrudes out of a back surface of the semiconductor substrate.

7. The method of claim 1, wherein a package component is also encapsulated in the first encapsulant, and wherein after the first encapsulant is planarized, the package component is revealed, and the optical die is covered by the protection layer.

8. The method of claim 1 further comprising:
    bonding the first package to a package component, wherein the first encapsulant is applied on the package component, and the method further comprises sawing the package component and the first encapsulant to form a second package.

9. The method of claim 1, wherein the optical die comprises a photodiode.

10. A method comprising:
    forming a first package component comprising:
        placing a die-attach film on a carrier;
        placing an optical die on the die-attach film, wherein the optical die comprises a micro lens, and the die-attach film extends into the micro lens to act as a filling layer; and
        encapsulating the optical die in a first encapsulant; and
    encapsulating the first package component in a second encapsulant to form a second package component, wherein a first top surface of the optical die is recessed lower than a second top surface of the second encapsulant to form a recess, and wherein the optical die is exposed to the recess.

11. The method of claim 10 further comprising, after the first package component is encapsulated in the second encapsulant, removing the die-attach film to expose the optical die.

12. The method of claim 10 wherein at a time the die-attach film is removed, the second encapsulant encircling the optical die comprises curved and concave top surfaces.

13. The method of claim 10, wherein the first encapsulant comprises a molding compound.

14. The method of claim 10 further comprising placing an optical fiber facing the micro lens, wherein the optical fiber is configured to optically couple to the optical die.

15. The method of claim 10 further comprising bonding the second package component to a third package component.

16. The method of claim 10, wherein the placing the first package component comprises pressing the optical die against the die-attach film, so that the die-attach film is pressed into an additional recess in the optical die.

17. A method comprising:
    placing a first package component comprising an optical die onto a carrier through a die-attach film, wherein the optical die comprises:
        a semiconductor substrate; and
        a micro lens at a top surface of the semiconductor substrate, wherein the die-attach film physically contacts the micro lens;

placing a second package component comprising a device die therein;

molding the first package component and the second package component in a molding compound;

removing the die-attach film that covers the optical die to reveal the micro lens; and forming an interconnect structure electrically coupling to the optical die and the second package component.

18. The method of claim 17, wherein the die-attach film extends into a recess of the semiconductor substrate, and wherein the micro lens is in the recess.

19. The method of claim 18 further comprising:

de-bonding a reconstructed wafer comprising the optical die and the die-attach film from the carrier; and sawing the reconstructed wafer to separate the first package component from other package components having a same structure as the first package component.

20. The method of claim 18, wherein the placing the first package component comprises pressing the optical die against the die-attach film, so that the die-attach film is pressed into the recess.

* * * * *